US012670304B2

(12) United States Patent
Wang et al.

(10) Patent No.: US 12,670,304 B2
(45) Date of Patent: *Jun. 30, 2026

(54) METHODS AND APPARATUSES FOR RESOURCE-OPTIMIZED FERMIONIC LOCAL SIMULATION ON QUANTUM COMPUTER FOR QUANTUM CHEMISTRY

(71) Applicants: IonQ, Inc., College Park, MD (US); University of Maryland, College Park, College Park, MD (US)

(72) Inventors: Qingfeng Wang, College Park, MD (US); Ming Li, College Park, MD (US); Yunseong Nam, College Park, MD (US)

(73) Assignees: IonQ, Inc., College Park, MD (US); University of Maryland, College Park, College Park, MD (US)

( * ) Notice: Subject to any disclaimer, the term of this patent is extended or adjusted under 35 U.S.C. 154(b) by 14 days.

This patent is subject to a terminal disclaimer.

(21) Appl. No.: 18/148,670

(22) Filed: Dec. 30, 2022

(65) Prior Publication Data

US 2023/0169381 A1 Jun. 1, 2023

Related U.S. Application Data

(63) Continuation of application No. 17/177,813, filed on Feb. 17, 2021.

(Continued)

(51) Int. Cl.
*G06F 30/27* (2020.01)
*G06F 9/50* (2006.01)
(Continued)

(52) U.S. Cl.
CPC ............ *G06F 30/27* (2020.01); *G06F 9/5094* (2013.01); *G06F 30/20* (2020.01); *G06N 10/20* (2022.01); *G06N 10/60* (2022.01)

(58) Field of Classification Search
None
See application file for complete search history.

(56) References Cited

U.S. PATENT DOCUMENTS

| | | | |
|---|---|---|---|
| 2018/0053112 A1* | 2/2018 | Bravyi | G06N 10/40 |
| 2018/0096085 A1* | 4/2018 | Rubin | G16C 10/00 |

(Continued)

OTHER PUBLICATIONS (Häser), "Møller-Plesset (MP2) perturbation theory for large molecules", Theoret. Chim. Acta 87, 147-173 (1993). https://doi.org/10.1007/BF01113535 (Year: 1993).*

(Continued)

*Primary Examiner* — Viker A Lamardo
*Assistant Examiner* — Leah M Feitl
(74) *Attorney, Agent, or Firm* — ARENTFOX SCHIFF LLP

(57) ABSTRACT

Aspects of the present disclosure describe a method including predicting a first set of ansatz terms and a first plurality of amplitudes associated with the first set of ansatz terms; minimizing energy of the system based on the first set of ansatz terms and the first plurality of amplitudes; computing perturbative corrections using one or more ansatz wavefunctions; determining whether energy of the system converges; and predicting, in response to determining that the energy of the system does not converge, a second set of ansatz terms and a second plurality of amplitudes associated with the second set of ansatz terms.

10 Claims, 13 Drawing Sheets

Related U.S. Application Data

(60) Provisional application No. 63/130,088, filed on Dec. 23, 2020, provisional application No. 62/979,974, filed on Feb. 21, 2020.

(51) Int. Cl.
   *G06F 30/20*     (2020.01)
   *G06N 10/20*     (2022.01)
   *G06N 10/60*     (2022.01)

(56) References Cited

U.S. PATENT DOCUMENTS

| | | | | |
|---|---|---|---|---|
| 2019/0095811 | A1* | 3/2019 | Antonio | G06N 10/60 |
| 2020/0293935 | A1* | 9/2020 | Greenberg | G06N 7/08 |
| 2020/0364601 | A1* | 11/2020 | Yamazaki | G06N 10/20 |
| 2020/0394549 | A1* | 12/2020 | Dallaire-Demers | G06N 10/00 |
| 2021/0042653 | A1* | 2/2021 | Brierley | G06N 10/60 |
| 2021/0255856 | A1* | 8/2021 | Cao | G06F 9/3001 |
| 2021/0398621 | A1* | 12/2021 | Stojevic | G16C 10/00 |
| 2023/0020166 | A1* | 1/2023 | Elfving | G16C 10/00 |

OTHER PUBLICATIONS

Li et al., "Variational Quantum Simulation for Quantum Chemistry". Adv. Theory Simul., 2: 1800182. 2019 https://doi.org/10.1002/adts.201800182 (Year: 2019).*

Grimsley Harper R. et al: "An adaptive variational algorithm for exact molecular simulations on a quantum computer", Nature Communications, vol. 10, No. 1, Dec. 2019 (Dec. 2019), XP055809857,DOI: 10.1038/s41467-019-10988-2 abstract; p. 1-p. 8; figure 1.

Yudong Cao et al: "Quantum Chemistry in the Age of Quantum Computing", Chemical Reviews, vol. 119, No. 19, Aug. 30, 2019 (Aug. 30, 2019), pp. 10856-10915, XP055632835, US ISSN: 0009-2665, DOI: 10.1021/ acs.chemrev.8b00803 Sections 4 and 5; p. 10869-p. 10895.

Ho Lun Tang et al: "qubit-ADAPT-VQE: An adaptive algorithm for constructing hardware-efficient ansatze on a quantum processor", arxiv.org, Cornell University Library, 201 Olin Library Cornell University Ithaca, NY 14853, Nov. 22, 2019 (Nov. 22, 2019), XP081538354, abstract; Sections I and II.

Qingfeng Wang et al: "Resource-Optimized Fermionic Local-Hamiltonian Simulation on Quantum Computer for Quantum Chemistry", arxiv.org, Cornell University Library, 201 Olin Library Cornell University Ithaca, NY 14853, Apr. 8, 2020 (Apr. 8, 2020), XP081640422, the whole document.

International Search Report issued in PCT/US2021/018556, dated Jun. 11, 2021.

Written Opinion of International Search Report issued in PCT/US2021/018556, dated Jun. 11, 2021.

* cited by examiner

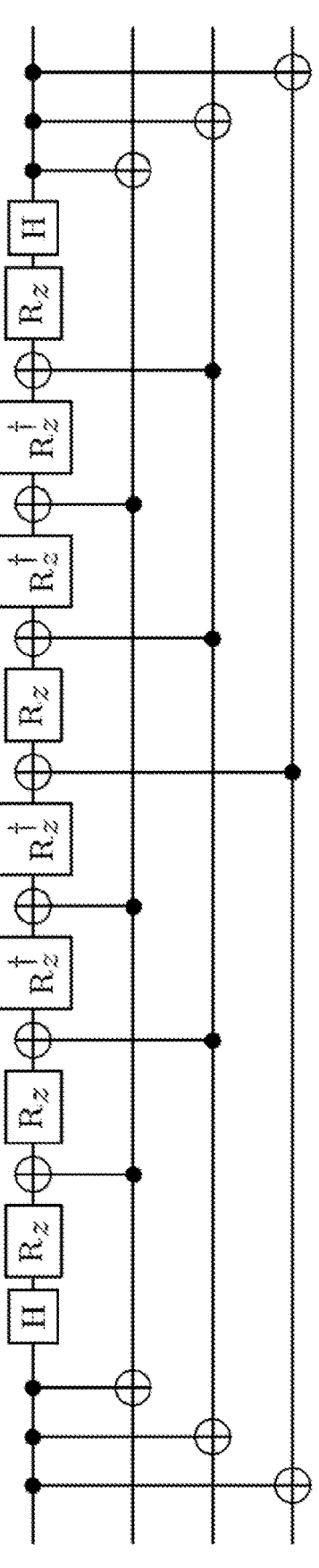
*FIG. 1*

300
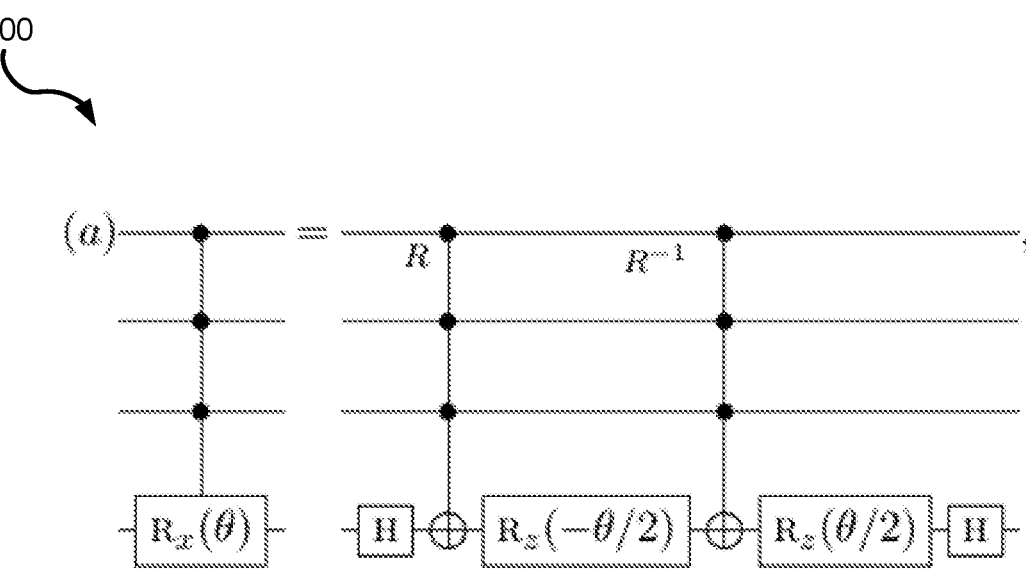
350
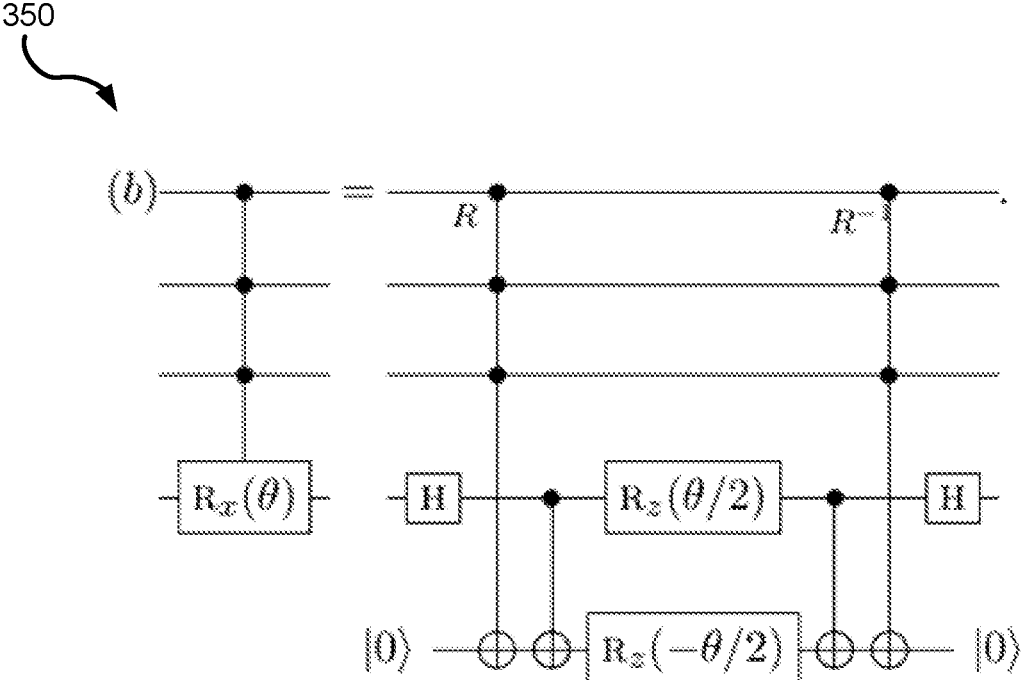
FIG. 3

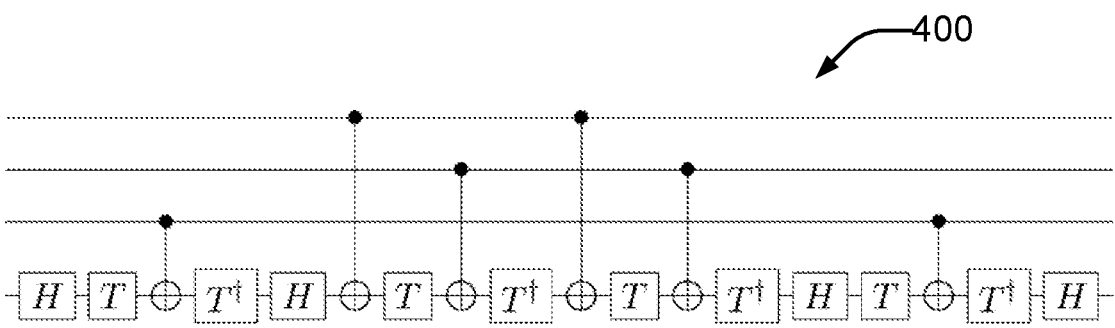
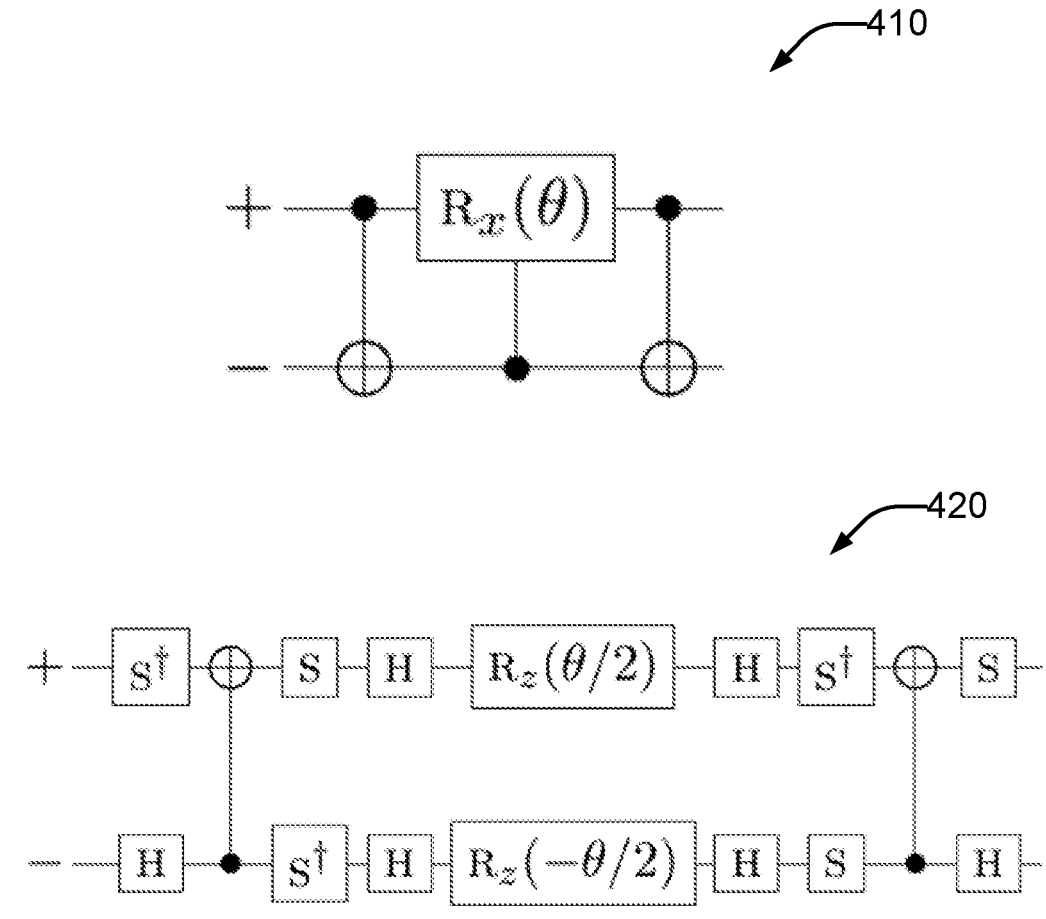
FIG. 4

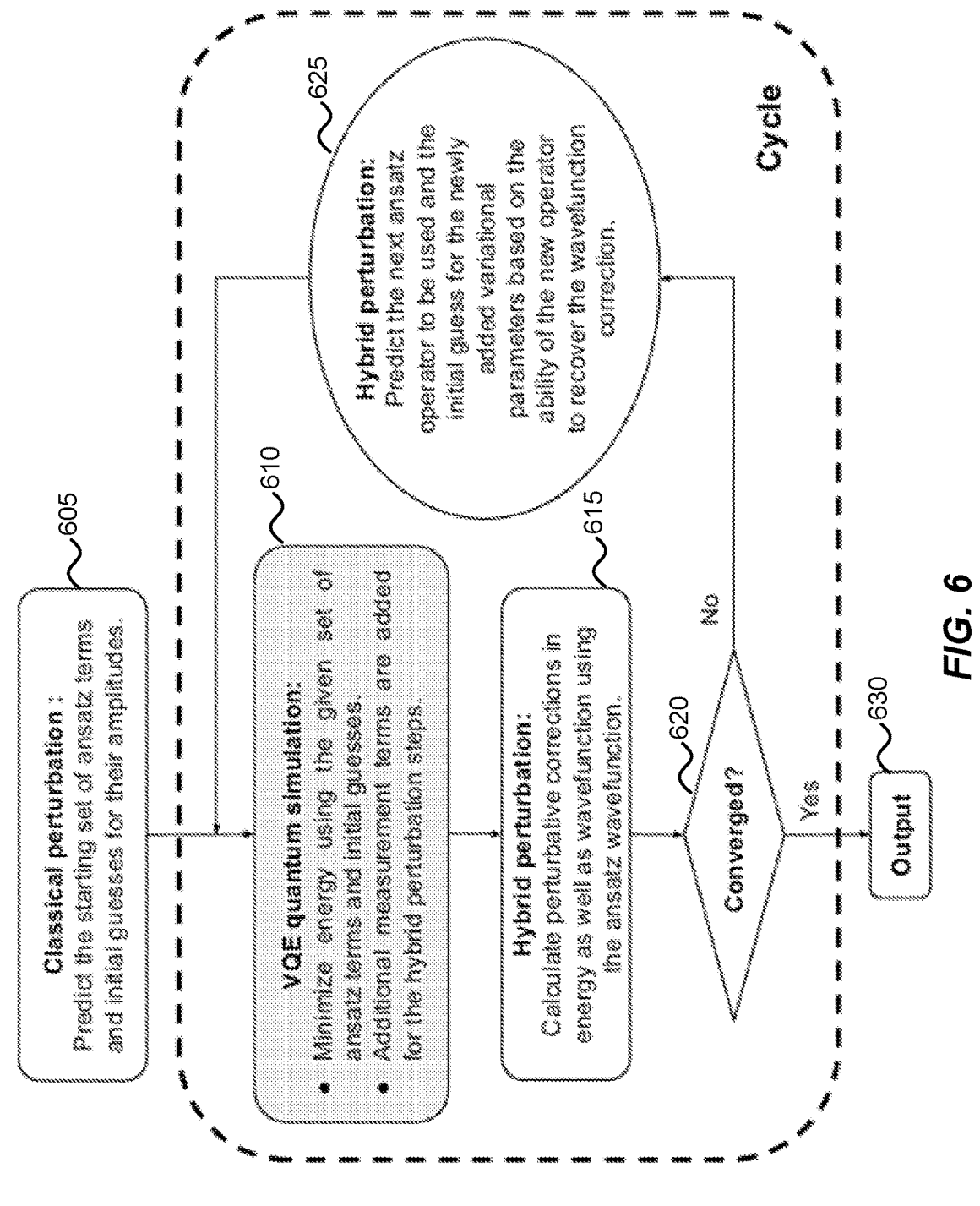

Classical perturbation :
Predict the starting set of ansatz terms and initial guesses for their amplitudes.

605

VQE quantum simulation:
Minimize energy using the given set of ansatz terms and initial guesses.
- Additional measurement terms are added for the hybrid perturbation steps.

610

Hybrid perturbation:
Calculate perturbative corrections in energy as well as wavefunction using the ansatz wavefunction.

615

Converged ?    620

No

Yes

Output    630

Hybrid perturbation:
Predict the next ansatz operator to be used and the initial guess for the newly added variational parameters based on the ability of the new operator to recover the wavefunction correction.

625

Cycle

METHODS AND APPARATUSES FOR RESOURCE-OPTIMIZED FERMIONIC LOCAL SIMULATION ON QUANTUM COMPUTER FOR QUANTUM CHEMISTRY

CROSS-REFERENCE TO RELATED APPLICATIONS

The present application is a continuation of U.S. application Ser. No. 17/177,813, filed Feb. 17, 2021, which claims the priority to and the benefit of U.S. Provisional Application No. 62/979,974 filed on Feb. 21, 2020, and U.S. Provisional Application No. 63/130,088 filed on Dec. 23, 2020, the contents of each of which are hereby incorporated by reference in their entireties.

GOVERNMENT LICENSE RIGHTS

This invention was made with government support under DOE Basic Energy Science grant: DOE BES award de-sc0019449. The government has certain rights in the invention.

TECHNICAL FIELD

Aspects of the present disclosure relate generally to improve resource utilization in a quantum computer.

BACKGROUND

An atomic flux may be generated and used as a source of neutral atoms or ions for certain systems. Some of those systems may include quantum information processing (QIP) systems, for example. Trapped ions are one of the leading implementations of QIP systems. Atomic-based qubits may be used as quantum memories, as quantum gates in quantum computers and simulators, and may act as nodes for quantum communication networks. Qubits based on trapped atomic ions enjoy a rare combination of attributes. For example, qubits based on trapped atomic ions have very good coherence properties, may be prepared and measured with nearly 100% efficiency, and are readily entangled with each other using suitable external control fields such as optical or microwave fields. These attributes make atomic-based qubits attractive for extended quantum operations such as quantum computations or quantum simulations.

One application for quantum simulations is using QIP systems to simulate Fermionic matters, including Fermions undergoing local interactions. A Fermionic system simulation on a quantum computer may include two approaches: a variational, quantum-classical hybrid strategy, suitable for the imperfect, pre-fault tolerant (pre-FT) quantum computers, and a Hamiltonian dynamics simulation based on quantum simulation algorithms, suitable for the fault-tolerant (FT) quantum computers. In the context of the ground-state energy estimation of a Fermionic system, the former leverages the efficient preparation of a good ansatz state for the sought-after ground state and the means to evaluate the expectation value of the Hamiltonian of the system for the prepared ansatz state, both enabled by the quantum computer. In contrast, the latter leverages the ability of a quantum computer to efficiently simulate quantum systems with a local Hamiltonian, which, combined with quantum phase estimation, allows the evaluation of the ground-state energy of the system. In the pre-FT regime, the quantum computational cost may be dominated by multi-qubit gates. In contrast, in the FT regime, where the circuit is typically written over the Clifford+T gate-set, the quantum computational cost may be dominated by the $$T: \begin{pmatrix} 1 & 0 \\ 0 & e^{\frac{i\pi}{4}} \end{pmatrix} = \text{gates},$$

many of which are used in the FT implementation of $$R_z(\theta) := \begin{pmatrix} e^{-i\theta/2} & 0 \\ 0 & e^{-i\theta/2} \end{pmatrix}$$

gates. Therefore, improvements in simulating quantum systems may be desirable.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of this disclosure includes a method including predicting a first set of ansatz terms and a first plurality of amplitudes associated with the first set of ansatz terms, minimizing energy of the system based on the first set of ansatz terms and the first plurality of amplitudes, computing perturbative corrections using one or more ansatz wavefunctions, determining whether energy of the system converges, and predicting, in response to determining that the energy of the system does not converge, a second set of ansatz terms and a second plurality of amplitudes associated with the second set of ansatz terms.

In another aspect of this disclosure includes a quantum computing device configured to perform the steps of predicting a first set of ansatz terms and a first plurality of amplitudes associated with the first set of ansatz terms, minimizing energy of the system based on the first set of ansatz terms and the first plurality of amplitudes; computing perturbative corrections using one or more ansatz wavefunctions, determining whether energy of the system converges, and predicting, in response to determining that the energy of the system does not converge, a second set of ansatz terms and a second plurality of amplitudes associated with the second set of ansatz terms.

Aspects of the present disclosure include predicting a first set of ansatz terms and first initial amplitudes associated with the first set of ansatz terms, minimizing energy of the system based on the first set of ansatz terms and the first initial amplitudes, calculating at least one of perturbative corrections in the energy or wavefunction based on one or more ansatz wavefunctions, determining whether energy of the system converges, and predicting, in response to determining that the energy of the system does not converge, a second set of ansatz terms and second initial amplitudes associated with the second set of ansatz terms.

Aspects of the present disclosure include a non-transitory computer readable medium having instructions stored therein that, when executed by a processor, cause the processor to predict a first set of ansatz terms and first initial amplitudes associated with the first set of ansatz terms, minimize energy of the system based on the first set of ansatz terms and the first initial amplitudes, calculate at least one of perturbative corrections in the energy or wavefunction based on one or more ansatz wavefunctions, determine whether energy of the system converges, and predict, in response to determining that the energy of the system does not converge, a second set of ansatz terms and second initial amplitudes associated with the second set of ansatz terms.

Aspects of the present disclosure include a system having a memory and a processor configured to predict a first set of ansatz terms and first initial amplitudes associated with the first set of ansatz terms, minimize energy of the system based on the first set of ansatz terms and the first initial amplitudes, calculate at least one of perturbative corrections in the energy or wavefunction based on one or more ansatz wavefunctions, determine whether energy of the system converges, and predict, in response to determining that the energy of the system does not converge, a second set of ansatz terms and second initial amplitudes associated with the second set of ansatz terms.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

The disclosed aspects will hereinafter be described in conjunction with the appended drawings, provided to illustrate and not to limit the disclosed aspects, wherein like designations denote like elements, and in which:

FIG. 1 is a diagram illustrating an example of a standard two-body interaction circuit according to some aspects of the present disclosure.

FIG. 3 is a diagram illustrating an example of a Triply-controlled $R_x(\theta)$) gate implementation with relative-phase triply-controlled not gates.

FIG. 4 illustrates examples of quantum circuits and optimized constructions according to some aspects of the present disclosure.

FIG. 6 is a flow diagram of a method for performing simulation according to some aspects of the present disclosure.

DETAILED DESCRIPTION

Figure 2:
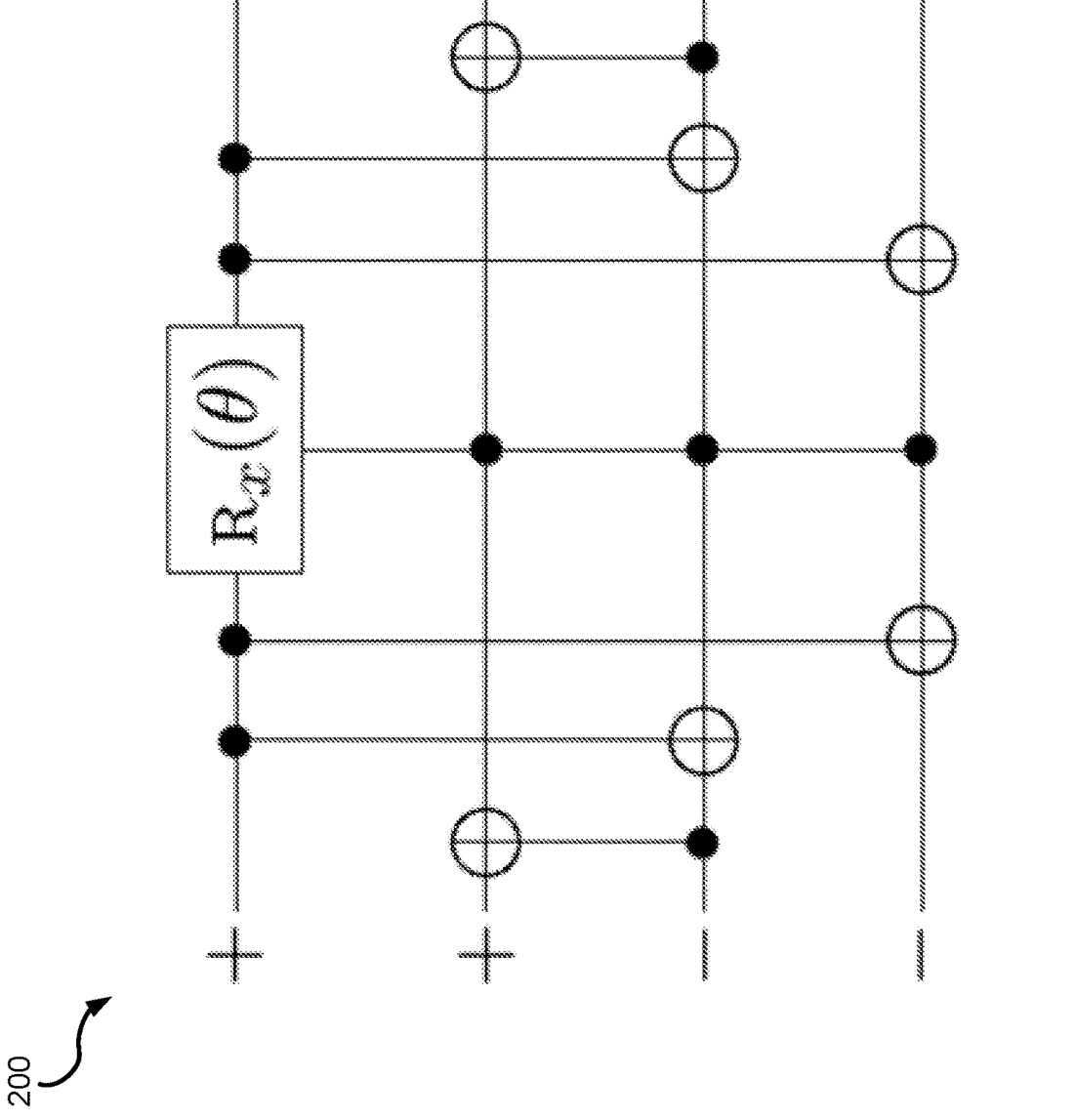
FIG. 2 is a diagram illustrating an example of a FT regime optimized circuit for the two-body term according to some aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

As described above, trapped ions may be used to implement qubits used in quantum information processing (QIP) systems. A typical ion trap geometry or structure used for quantum information and metrology purposes is the linear radio frequency (RF) Paul trap (also referred to as an RF trap or simply a Paul trap), where nearby electrodes hold static and dynamic electrical potentials that lead to a confinement of the ions. Qubits based on trapped ions may be used as different types of devices, including but not limited to quantum memories, quantum gates in quantum computers and simulators, and nodes for quantum communication networks.

As used in this disclosure, the terms "atoms" and "neutral atoms" may be interchangeable, while the terms "ions" and "atomic ions" may be interchangeable. Moreover, the terms "atomic ions," "ions," "atoms," and "neutral atoms" may describe the particles that are generated from a source material and that are to be confined or trapped, or are actually confined or trapped, in a trap to form a crystal, lattice, or similar arrangement or configuration. The term "plasma" may describe a flux of neutral atoms, ions, or both.

An aspect of the present disclosure optimizes quantum circuits that implement Fermionic simulations in both the pre-FT and FT regimes. The cost functions considered include the number of multi-qubit gates in the pre-FT regime and the number of $R_z$ gates or the number of time steps $R_z$ gates need be applied in the simulation circuit in the FT regime. Another aspect of the present disclosure includes a product-formula (PF) based approach for the FT regime and a unitary coupled cluster (UCC) ansatz based variational approach for the pre-FT regime. In other aspects, the Fermionic simulations may include using a second-order perturbation based approach and the generalized Fermion to qubit operator transformation.

In some implementations, the simulation results in the FT regime may be utilized in chemical, pharmaceutical, physical, and other applications. The simulation may be real-time.

In certain implementations, the simulation results in the pre-FT regime may be utilized to compute the ground states of particles. The ground states of the particles may be used for determining chemical reactions, bonding properties, energetic states, etc.

In one aspect of the present disclosure, in the FT regime, the $R_x(\theta)$ and T gate counts may be optimized along with the ancilla qubits counts, assuming the use of a product-formula algorithm for implementation. A saving ratio of two in the gate counts and a saving ratio of eleven in the number of ancilla qubits may be achieved in some instances. In the pre-FT regime, the number of two-qubit gate counts may be optimized.

An aspect of the present disclosure presents a framework that enables bootstrapping the VQE progression towards the convergence of the ground-state energy of the fermionic system. The framework, based on the perturbation theory, may be capable of improving the energy estimate at each cycle of the VQE progression. The improved energy approach may result in savings of quantum resources (e.g., the number of qubits and/or quantum gates) required to reach a pre-specified tolerance from the known ground-state energy.

For the PF regime, an aspect of the present disclosure aims to reduce the number of $R_x(\theta)$ gates and the $R_z(\theta)$ gate depths because an $R_z(\theta)$ gate may utilize more than one T gate, which is resource intensive.

In one implementation, a Fermionic system evolves according to a time-independent, local, second-quantized Hamiltonian H in the occupation basis:

$$H = \Sigma_{p,q} h_{pq} a_p^\dagger a_p + \Sigma_{p,q,r,s} h_{pqrs} a_p^\dagger a_q^\dagger a_r a_s, \qquad (1)$$

where $a_p^\dagger$ and $a_q$ denote the Fermionic creation and annihilation operators on the pth and qth levels, respectively, and $h_{pq}$ and $h_{pqrs}$ denote single- and double-Fermion Hamiltonian coefficients, respectively. The Fermionic operators follow the canonical anti-commutation relations $$\{a_j, a_k\} = 0, \ \{a_j^\dagger, a_k^\dagger\} = 0, \ \{a_j a_k^\dagger\} = \delta_{jk} 1, \qquad (2)$$

where $\{A, B\}$ denote the anticommutator $AB + BA$, $\delta_{jk}$ is a Kronecker delta, and 1 is an identity operator. For the implementations on a quantum computer, the Fermionic operators may be transformed using the Jordan-Wigner (JW) transformation, defined for a n-qubit system according to $$a_j^\dagger = 1^{\otimes j} \otimes \sigma + \otimes \sigma_z^{\otimes n-j-1}, \ a_j = 1^{\otimes j} \otimes \sigma - \otimes \sigma_z^{\otimes n-j-1}, \qquad (3)$$

where $j \in [0, n-1]$, $\otimes$ denotes tensor product, $$\sigma^+ := \begin{pmatrix} 0 & 0 \\ 1 & 0 \end{pmatrix}, \sigma_- := \begin{pmatrix} 0 & 1 \\ 0 & 0 \end{pmatrix}, \text{ and } \sigma_z := \begin{pmatrix} 0 & 0 \\ 0 & -1 \end{pmatrix}.$$

To implement the evolution operator $U_{evolution} = e^{-iHt}$ on a quantum computer in a quantum dynamic simulation approach, where H is the system Hamiltonian and t is the duration to evolve the system forward in time, an algorithm for implementing $U_{evolution}$ may include the technique of the 2kth order PF, whose gate complexity is $O(5^{2n} t^{1+1/2k}/\epsilon^{1/2k})$. The technique of the 2kth order PF may result in a more efficient quantum circuit in practice. Other algorithms that may be used to implement $U_{evolution}$ include the asymptotically optimal quantum signal processing with the gate complexity $O(t+\log(1/\epsilon)/\log \log(1/\epsilon))$, where $\epsilon$ is the algorithmic approximation error.

An aspect of the present disclosure includes a quantum-classical hybrid approach based on the technique of the variational quantum eigensolver. The technique includes implementing $U_{ansatz} = e^{(T-T^\dagger)}$ on a quantum computer, where T is the cluster operator, defined according to the UCC approach. By tuning the variational parameters in T, in a typical VQE approach, $\langle \psi | U_{ansatz}^\dagger H U_{ansatz} | \psi_0 \rangle$ is minimized, where $|\psi_0\rangle$ is an initial state that is assumed to be close to the target ground state of H and can readily be prepared on a quantum computer. A goal of this hybrid approach is then to estimate the ground state energy of the Fermionic system with the Hamiltonian of the form shown in equation (1).

In an alternative implementation, a unitary ansatz evolution operator $U_{ansatz}$ may be implemented on a quantum computer (e.g., unitary coupled cluster ansatz). The one or more variational parameters of the $U_{ansatz}$ may be tuned to minimize $\langle \psi | U_{amsatz}^\dagger H U_{amsatz} | \psi_0 \rangle$.

In certain aspects, a complementary approach, based on the perturbation theory, to the hybrid method described above may be used to estimate the ground state energy.

FIG. 1 is an example of a block diagram illustrating a two-body interaction circuit 100 that implements $$\exp\left[-i\left(\frac{\theta}{2}\right)\sigma_+ \otimes \sigma_+ \otimes \sigma_- \otimes \sigma_-\right].$$

In some implementations, by expanding $\sigma_+\sigma_+\sigma_-\sigma_-$ ($\otimes$ omitted for clarity) into the particular ordering of $\sigma_x\sigma_x\sigma_x\sigma_x$, $\sigma_x\sigma_x\sigma_y\sigma_y$, $\sigma_x\sigma_y\sigma_y\sigma_x$, $\sigma_x\sigma_y\sigma_x\sigma_y$, $\sigma_y\sigma_y\sigma_x\sigma_x$, $\sigma_y\sigma_x\sigma_x\sigma_y$, $\sigma_y\sigma_x\sigma_y\sigma_x$, $\sigma_y\sigma_y\sigma_y\sigma_y$, and implementing them one after the other, the two-body interaction circuit 100 may be obtained after applying well-known circuit optimization routines.

In some implementations, the $2k^{th}$ order PF algorithm may be utilized in the simulation of Fermionic systems. After the JW transformation has been performed on the Hamiltonian H in equation (1), the time evolution operator may be written as:

$$\exp\left(-i\sum_{j=1}^{L}\theta_j\hat{\sigma}^{(j)}\right) \approx [S_{2k}(\lambda)]^r, \qquad (4)$$

where $\lambda := \dfrac{1}{r}$, $\hat{\sigma}^{(j)} = \bigotimes_i \hat{\sigma}^{(i,j)}$, where $\hat{\sigma}^{(i,j)} \in \{\sigma_+, \sigma_-, \sigma_z\}$, and $$S_1(\lambda) := \prod_{j=1}^{L} \exp\left(-i\theta_j\hat{\sigma}^{(j)}\lambda\right),$$

$$S_2(\lambda) := \prod_{j=1}^{L} \exp\left(-i\theta_j\hat{\sigma}^{(j)}\lambda/2\right)\prod_{j=L}^{1} \exp\left(-i\theta_j\hat{\sigma}^{(j)}\lambda/2\right),$$

$$S_2(\lambda) := [S_{2k-2}(p_k\lambda)]^2 S_{2k-2}((1-4p_k)\lambda)[S_{2k-2}(p_k\lambda)]^2, \qquad (5)$$

with $$p_k := \frac{1}{\left(4 - 4^{\frac{1}{(2k-1)}}\right)}$$

with for k>1. The individual exponential terms, hereafter referred to as a Trotter term, are of the form $\exp^{(-i\theta'_j \otimes_i \hat{\sigma}(i,j))}$, where $\theta'_j$ is a suitably scaled $\theta_j$. A standard circuit that implements a Trotter term may be well-known in the art. An optimized quantum circuit may implement an exemplary Trotter term $$e^{\frac{-i\theta(\sigma_+\sigma_+\sigma_-\sigma_-+h.c.)}{2}}.$$

In certain implementations, the two-body Trotter term $$e^{\frac{-i\theta(\sigma_+\sigma_+\sigma_-\sigma_-+h.c.)}{2}}$$

7 implements a $R_X$-rotation between $|0\ 0\ 1\ 1\rangle$ state and $|1\ 1\ 0\ 0\rangle$ state. For an input state of $|b_0b_1b_2b_3\rangle$, where the $m^{th}$ qubit variable $b_m$ includes a value of either 0 or 1, $|b_0b_1\otimes b_2b_0\otimes b_2b_0\otimes b_3\rangle$ maps $|0011\rangle$) to $|0111\rangle$), and $|1100\rangle$ to $|1111\rangle$. A triply controlled $R_X$-rotation on the zeroth qubit would implement the desired rotation on the mapped state. An example of a quantum circuit 200 that implements the two-body term, constructed according to aforementioned method, is shown in FIG. 2.

A triply-controlled $R_X$ gate in FIG. 2 may be implemented using single- and/or two-qubit gates. For example, the triply-controlled $R_X$ gate may be implemented with Hadamard, $R_Z$, and/or triply-controlled NOT gates. In one implementation, the triply-controlled $R_X$ gate may be relative-phase triply controlled not gates, as shown in FIG. 3(*a*). A circuit 300 shown in FIG. 3(*a*) decreases the $R_Z$ count per two-body Trotter term from the standard eight to two.

In some aspects of the present disclosure, the Trotter term above may be implemented using $|0\rangle$ -state initialized ancilla qubit as shown in FIG. 3(*b*). A circuit 350 shown in FIG. 3(*b*) may require $R_Z$ depth of one per two-body Trotter term. This construction may be $R_Z$-depth optimal for a two-body Trotter term implementation for the FT regime Fermion simulations.

In some implementations, an $R_Z$- and T-gate optimized implementation of a triply-controlled $R_X$ gate (such as the circuit 300) includes the relative phase Toffoli gate instead of the conventional Toffoli gate to reduce the T-gate count. In some aspects, the relative phase Toffoli gate with three controls may not require an ancilla qubit.

The circuit 300 includes two $R_Z$ in series configuration. To reduce the $R_Z$ depth, an ancilla qubit prepared to $|0\rangle$ may be introduced. An example of an $R_Z$-depth one construction of the triply-controlled $R_X$ gate is shown in the circuit 350. In some cases, should the same angle rotations happen in multiple qubits at the same time (a possibility if a molecule of interest that is being simulated has symmetries), a weight-sum method may be employed to exponentially reduce the number of $R_Z$ gates at a modest cost in the number of qubits and T gates. Two $R_Z$ gates to be applied in parallel may not benefit from the weight-sum method. FIG. 4 shows an example of a triply-controlled, relative phase Toffoli gate 400. The triply-controlled, relative phase Toffoli gate 400 is a logical NOT gate. FIG. 4 also shows a circuit 410 for a single-body operator $e^{-i\theta/2(\sigma+\sigma-+h.c.)}$. FIG. 4 further shows an $R_X$-depth optimized circuit 420 of the single-body term. The circuit 420 does not require ancilla qubits or two $R_Z$ gates in one layer.

In certain implementations, the technique described above may be implemented as a generalization of a single-body term. The generalization may be applied to an arbitrarily many-body terms.

Figure 5:
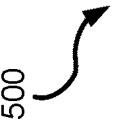
FIG. 5 is a diagram illustrating another example of a FT regime optimized circuit for the two-body term according to some aspects of the present disclosure.

In certain instances, if there are $\sigma_{x,y,z}$ operators that act on some other qubits, e.g., due to the JW transformation, the two-body circuit may be modified as follows. For example, there is a $\sigma_z$ operator acting on an additional qubit. In this case, to implement $$e^{\frac{-i\theta(\sigma_+\sigma_+\sigma_-\sigma_-\sigma_z+h.c.)}{2}},$$

the circuit 200 in FIG. 2 may be modified into a circuit 500 shown in FIG. 5.

8

In certain implementations, for the single-body operator

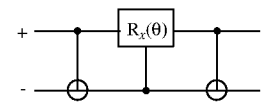

in analogy to the two-body case shown above, we may use:

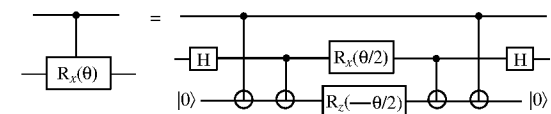

to implement the operator. To implement the controlled $R_X$ gates optimally in terms of $R_Z$-gate depth, we implement the gate by:

which, when inserted to the single-body operator circuit, results in a $R_Z$ depth one circuit.

In the pre-FT regime, the ground state energy of the system whose Hamiltonian is given by the form (1) may be calculated, for example, by the variational quantum eigensolver (VQE) approach, where an ansatz state is created on a quantum computer to evaluate the energy of the ansatz state. In the VQE approach, by iteratively calling the quantum computer to compute the energies of parametrized ansatz states, the energy may be minimized (locally or globally) to obtain the ground state of the target system.

In another aspect of the present disclosure, an aspect of the present disclosure may be used in the pre-FT regime for the ground state energy calculation. A type of ansatz states $|\Psi_{ansatz}\rangle$ may be transformed from an initial state $|\Psi_0\rangle$ using a parametrizable unitary ansatz evolution operator $U_{ansatz}$, such as $|\Psi_{ansatz}\rangle = U_{ansatz}|\Psi_0\rangle$. The operator $U_{ansatz}$ may be expressed in exponential form $U_{ansatz} = e^{(Z-Z^\dagger)}$. By varying the parameters in Z, the ansatz state energy $\langle \Psi_{ansatz}|H|\Psi_{ansatz}\rangle = \langle \Psi_0|U^\dagger HU|\Psi_0\rangle$ may be variationally minimized. With a proper fermion to qubit basis transformation, the energy expectation value may be evaluated efficiently on a quantum computer (the quantum resource cost is the implementation cost of the operator $U_{ansatz}$). The procedure that follows may be implemented with any ansatz with a unitary evolution operator $U_{ansatz}$. In one example, the unitary coupled cluster ansatz with single and/or double excitations (UCCSD) may be used. Other examples include k products of the exponential of distinct pair coupled-cluster double excitation operators (k-Up-CCGSD) or straightforward unitary extensions of generalized unitary coupled-cluster (UCCGSD) ansatz.

In some implementations, the approach may start with a ground state Hartree-Fock (HF) wavefunction $|\Psi_0\rangle$ that may be calculated on a classical computer and implemented on a quantum computer. Next, the wavefunction $|\Psi_0\rangle$ may be evolved with a unitary operator $U_{ansatz} = e^{(Z_{UCCSD} - Z_{UCCSD}^\dagger)}$, where $Z_{UCCSD} = \Sigma_{l=1}^2 Z_l$ may be a cluster operator. $Z_{1,2}$ may be the single and double excitation operators, respectively, and written in second quantization as:

$$Z_1 = \sum_{\substack{p \in virt \\ r \in occ}} t_{pr} a_p^\dagger a_r, \tag{8}$$

-continued $$Z_2 = \sum_{\substack{p,q \in virt \\ r,s \in occ}} t_{pqrs} a_p^\dagger a_q^\dagger a_r a_s,$$

where $t_{pr}$ and $t_{pqrs}$ are variational parameters and virt and occ respectively denote virtual and occupied levels. To minimize the size of a quantum circuit that implements $U_{ansatz}$ that may lead to the ansatz state energy close to the ground state energy within a pre-specified tolerance, some or all terms in the cluster operation may be considered. For example, only a subset of all the parameters $t_{pr}$ and $t_{pqrs}$ may be included in the VQE approach, and the remaining parameters may be set to zero.

In some aspects of the present disclosure, two procedures may be used to reduce circuit complexity of the approach detailed above, represented by the total number of multi-qubit gates. A first-order PF algorithm may be used to implement the ansatz, although extensions to any higher order PF algorithms are straightforward. Alternatively or additionally, a hybrid framework based on perturbation theory may also be used to reduce the circuit complexity. In the hybrid framework, the important ansatz terms may be included in the larger instance of the VQE circuit based on the smaller instance of the VQE circuit, effectively boot-strapping the VQE progression towards the ground-state energy estimate of the simulated system.

In certain implementations, a general framework may leverage the power of perturbation theory to optimize VQE-based quantum simulation by predicting the ansatz terms to include in the UCCSD ansatz and correcting the VQE result via post processing. The framework may optimize both the total number of VQE executions as well as the size of the ansatz state preparation circuits used to reach the convergence in the ground-state energy estimate. The derivation of a simple perturbation scheme that can straightforwardly be implemented in the framework may be referred to as a hybrid second order Møllar-Plesset perturbation (HMP2) method.

In some aspects of the present disclosure, any general (i.e., not specific to any system) unitary ansatz operator may be written as:

$$U = e^{(Z-Z^\dagger)}, \text{ where } Z = \Sigma_{\{\alpha\}} f_\alpha(\{t_\beta\}) D_\alpha \quad (16)$$

where the sum is over a set of orbital sequences $\{\alpha\}$, $f_\alpha$ are real functions of the set of variational parameters $\{t_\beta\}$, and $D_\alpha$ is a generic orbital substitution operator that substitutes the orbitals in a wavefunction according to the orbital sequence $\alpha$. In one example, a single orbital substitution operator $D_{p^\dagger q} = a_p^\dagger a_q$ substitutes orbital q with p. For a specific general ansatz approach there is a full set of variational parameters $T_{full} = \{t_\beta\}$ that may be used to parametrize the ansatz evolution operator. In the case of UCCSD, $T_{full} = \{t_{pr}, t_{pqrs} | p, q \in virt; r, s \in occ\}$, $\{\alpha\} = \{p^\dagger r, p^\dagger q^\dagger rs | q \in virt; r, s \in occ\}$, and $f_\alpha = t_\alpha$.

Next, a set of ansatz evolution operators $\{U_{di\ i}\}$ may be generated, with each element being the unitary operator that induces an ansatz state with a subset $T_i$ of the full variational parameters $T_{full}(T_i \subset T_{full})$. At least some of the parameters in the complement set $T_{full} \backslash T_i$ may be fixed to an ordered set of default values $T_{full}^{(0)}$. The default values may be absorbed into $f_\alpha$ and the elements in the complement set $T_{full} \backslash T_i$ may be set to zero. For every $U_{T_i}$ in $\{U_{T_p}\}$, the ansatz state energy may be variationally minimized as $E_{T_i} = min_{elements(T_i) \in \mathbb{R}}$ $\langle \Psi_0 | U_{T_i}^\dagger H U_{T_i} | \Psi_0 \rangle$, where elements $(T_i)$ denotes the elements of the set $T_i$. For a particular general ansatz through the VQE approach in the pre-FT regime, a goal is to find a $U_{T_i}$ with reduced circuit complexity that satisfies $|E_{T_i} - E_{T_{full}}| < \ominus$ with $\ominus$ a predetermined error criterion.

In one aspect of the present disclosure, convergence may be achieved with reduced circuit complexity by starting with an operator with a small set of variational parameters that may achieve the error threshold and iteratively grow the set. Going from the mth iteration to the (m+1)th one, the set of variational parameters in the operators grows and satisfies $T_m \subset T_{m+1}$. One aspect to achieve rapid convergence may be the selection of the additional variational parameter(s) to include between iterations. For example, an aspect of the present disclosure may include iteratively selecting next variational parameters to include in the ansatz state preparation based on the size of the perturbatively predicted wavefunction correction amplitude for a given ansatz state whose variational parameters are already optimized (e.g., via the conventional means of VQE without the perturbative energy correction).

FIG. 6 illustrates a flow diagram of the proposed method 600. The method 600 may include a systematic way of using perturbation methods to improve quantum resources required for the VQE approach. Specifically, the method 600 may cause the system to rapidly converge to the ground state energy of quantum circuits. The rapid convergence may depend on the selection of individual excitation terms in equation (8) used to prepare the subset of variational parameters in the UCCSD example.

Figure 12:
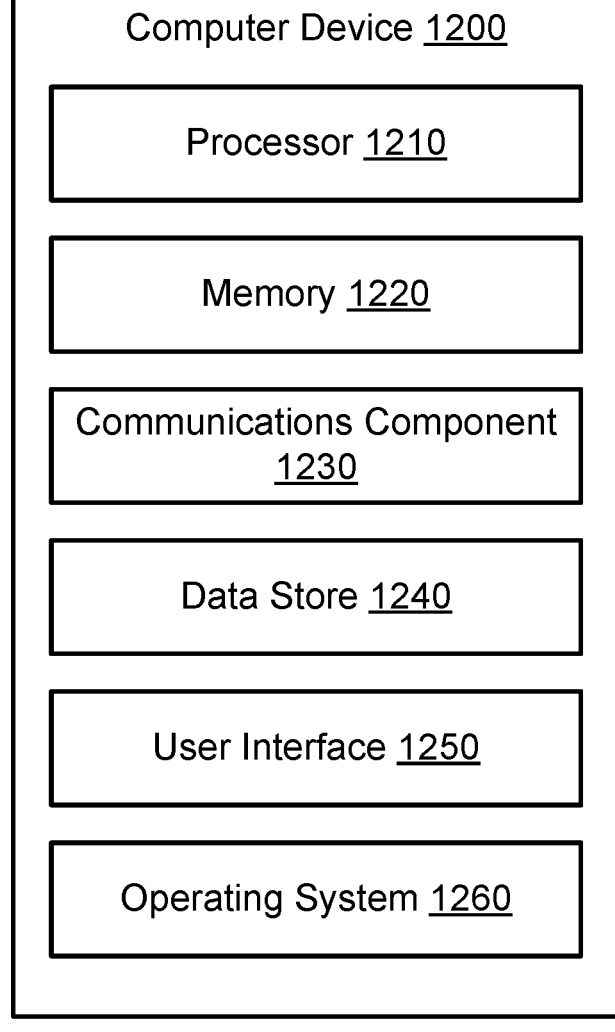
FIG. 12 is a diagram that illustrates an example of a computer device according to some aspects of the present disclosure.

In one illustrative implementation, as in the conventional VQE approach for Fermionic simulations, the method begins with the ground state Hartree-Fock wavefunction of the single particle Hamiltonian as $|\Psi_0\rangle$. The method 600 may be implemented by a classical computer, a quantum computer, or a hybrid classical-quantum computer. In one aspect, the method 600 may be implemented by a computer device 1200 as discussed below (FIG. 12).

At block 605, the method 600 may predict the starting set of the ansatz terms and initial guesses for the associate amplitudes. For example, the first step may include determining the initial evolution operator $U_{T_1}$ to use for the first iteration of VQE. In an implementation, using the two-particle Hamiltonian as perturbation, energy, and wavefunction corrections may be calculated using classical algorithms. From the perturbed wavefunction, the amplitudes of individual excited states may be extracted in the single-particle Hamiltonian basis. These amplitudes may serve as the initial guesses of the variational parameters for the first round of VQE simulation, which could significantly reduce the number of evaluations of the quantum circuit comparing to all-zeros or random initial guesses. If the energy convergence criteria is $\delta_E$ (i.e., The entire simulation is considered to be converged when the magnitude of energy change associated with addition of any extra ansatz term is smaller than $\delta_E$), the initial ansatz set may include the ansatz terms whose contribution to correlation energy is greater than $f(\delta_E)$, where a standard choice of function $f(\delta_E)$ may simply be $\delta_E$.

In an aspect of the present disclosure, the method 600 may include choosing a method of perturbation, such as the second order Møller-Plesset (MP2) perturbation theory. The method 600 may include selecting a set of ansatz. In one implementation, the set of ansatz may be compatible with a unitary kind for use on a quantum computer later. An example of includes UCCSD. The set may contain a finite number of ansatz terms with each term being distinct. The method 600 may execute the chosen method of perturbation with the selected set of ansatz on a classical computer. The execution may result in the initial strengths of perturbation associated with each ansatz term, to be used by a quantum computer.

At block 610, with the initial set of ansatz terms and their initial variational parameter values, the method 600 may execute the first round of VQE simulation to minimize the energy $E_{T_i} = \langle \Psi_0 | U_{T_i}^\dagger H U_{T_i} | \Psi_0 \rangle$. In some instances, additional measurement terms may be added for the hybrid perturbation steps.

At block 615, once the energy is minimized and the ansatz state converges, the method 600 may calculate the perturbative corrections in energy and/or wavefunction using the ansatz wavefunction. For example, the method 600 may calculate corrections to the correlation energy and the wavefunction. The resulting total energy of this cycle may be the summation of the energy correction and the VQE energy. Details of the hybrid perturbative method is discussed in further detail below.

In certain aspects of the present disclosure, equipped with the ansatz term and the initial perturbation strengths determined by the execution of the chosen method of perturbation with the selected set of ansatz on a classical computer, the method 600 may compose the VQE quantum circuit that may create an ansatz state for the sought-after ground state. Based on the Hamiltonian of the system to be simulated, the method 600 may attach the measurement basis transformation circuit required for each term in the Hamiltonian whose expectation value is to be determined. In case of the hybrid approach, such as HMP2, the method 600 may additionally consider an energy correction operator, which tends to incur additional measurement basis transformation circuits to consider. In some implementations, the method 600 may compile and/or optimize the circuits, and run the resulting circuits on a quantum computer to evaluate the expectation value of the Hamiltonian. In case of hybrid, the method 600 may additionally or alternatively evaluate the expectation value of the energy correction term on a quantum computer. The method 600 may use a classical optimizer to feed forward new variational parameters to try out, which may replace the initial perturbation strengths used above. The processes above may be repeated until the energy estimate has converged to a minimum.

At block 620, the method 600 may determine whether the energy calculation converges.

At block 625, the method 600 may predict the next ansatz operator to be used and the initial guess for the newly added variational parameters based on the ability of the new operator to recover the wavefunction correction. For example, before starting the next cycle, the method 600 may optionally identify a pool of operators that may be the immediate successor of the current operator. Next, the method 600 may evaluate how much each operator in the pool may account for towards the perturbative wavefunction correction. The operator that can recover the wavefunction correction the most may be used for the next cycle (if any), and the way of recovering the correction may indicate the initial guesses of the newly added variational parameters in the next cycle. The initial variational parameter values of the ansatz terms that continue to be a part of the next VQE simulation may be imported from the previous cycle.

In some implementations, if the energy estimate based on the chosen ansatz is still far from the actual ground state energy, or in the absence of the known ground state energy, the method 600 may make an educated guess by systematically increasing the ansatz size (described below). The method 600 may include determining whether further increasing ansatz changes the energy estimates significantly.

The method 600 may include determining, based on the hybrid perturbation framework, which ansatz term to add to the existing ansatz. The initial guess for the strength of the perturbation associated with the new term is determined based on the hybrid framework as well.

At block 630, the method 600 may output the simulation result.

In one aspect, the techniques described in the method 600 may be executed by a classical computer to generate simulation parameters (e.g., ansatz terms) for the execution of a quantum circuit on a quantum computer. In another aspect, the techniques described in the method 600 may be executed a hybrid classical-quantum computer to generate simulation parameters for the execution of a quantum circuit on the hybrid classical-quantum computer.

The cycle iterates the outlined procedure of running the VQE simulation and the hybrid perturbation calculation, until the convergence of the total energy is achieved (at block 630).

The Møller-Ples set perturbation method may be hybridized with VQE simulation hereafter, referred to as HMP2. The HMP2 method may improve each VQE cycle in terms of energy via a perturbative energy correction and optimizing the ansatz operator to use in the next cycle (if any) through a perturbative wavefunction correction. In the mth VQE cycle, the energy of the ansatz state $E_{T_m}$ (in the context of the first-order perturbation theory) may be written as:

$$E_{T_m} = \langle \Psi_0 | U_{T_m}^\dagger H U_{T_m} | \Psi_0 \rangle = \langle \Psi_0 | F + (U_{T_m}^\dagger H U_{T_m} - F) | \Psi_0 \rangle = \quad (17)$$

$$\langle \Psi_0 | F | \Psi_0 \rangle + \langle \Psi_0 | U_{T_m}^\dagger H U_{T_m} - F | \Psi_0 \rangle = E_0 + (E_{T_m} - E_0) = E^{(0)} + E_{T_m}^{(1)},$$

where F is the Fock operator, $E_0$ is the sum of orbital energies, and $E^{(0)} = E_0$ is the zeroth order energy, and $E_{T_m}^{(1)} = E_{T_m} - E_0$ is the first order correction energy. Based on perturbation theory, a second order correction to the energy may be written as:

$$E_{T_m}^{(2)} = \sum_{\{\alpha'\}} \frac{|\langle \Psi_{D_{\alpha'}} | V_{T_M} | \Psi_0 \rangle|^2}{\Delta E_{D_{\alpha'}}}, \quad (18)$$

where $V_{T_m} = U_{T_m}^\dagger H U_{T_m} - F$. The set of orbitals sequences $\{\alpha'\}$ may be the same or different as the set $\{\alpha\}$. The set $\{\alpha'\}$ may include the set $\{\alpha\}$ when $\{\alpha\}$ is a finite set. The energy $\Delta E_{D_{\alpha'}}$ may be the orbital energy difference of the orbital substitutions. In one implementation, $\Delta E_{D_q^\dagger q} = E_q - E_p$, where $E_p$ and $E_q$ may be the orbital energies of p the pth and the qth orbitals, respectively. Inserting $V_{T_m} = U_{T_m}^\dagger H U_{T_m} - F$ into equation (18), the numerator of equation (18) becomes:

$$|\langle \Psi_{D_{\alpha'}} | V_{T_m} | \Psi_0 \rangle|^2 = |\langle \Psi_{D_{\alpha'}} | U_{T_m}^\dagger H U_{T_m} - F | \Psi_0 \rangle|^2 = \quad (19)$$

$$|\langle \Psi_{D_{\alpha'}} | U_{T_m}^\dagger H U_{T_m} | \Psi_0 \rangle - \langle \Psi_{D_{\alpha'}} | F | \Psi_0 \rangle|^2 = |\langle \Psi_{D_{\alpha'}} | U_{T_m}^\dagger H U_{T_m} | \Psi_0 \rangle|^2,$$

where we used $\langle \Psi_{D^\alpha} | F | \Psi_0 \rangle = 0$.

In order to apply the VQE results (e.g., the ansatz wavefunction $|\Psi_{ansatz}^{T_m}\rangle$) directly to the perturbation calculation, the following terms are inserted into equation (19): $\tilde{Z}_{T_m} = Z_{T_m} - Z_{T_m}^\dagger$ where $U_{T_m} = e^{ZT_{rm}}$ and $\tilde{D}_\alpha = D_\alpha - D_{\alpha'}$ to obtain:

$$\left| \langle \Psi_{D_{\alpha'}} | U_{T_m}^\dagger H U_{T_m} | \Psi_0 \rangle \right|^2 = \tag{20}$$

$$\left| \langle \Psi_0 | \tilde{D}_{\alpha'}^\dagger U_{T_m}^\dagger H U_{T_m} | \Psi_0 \rangle \right|^2 = \left| \langle \Psi_{ansatz}^{T_m} | U_{T_m} \tilde{D}_{\alpha'}^\dagger, U_{T_m}^\dagger H | \Psi_{ansatz}^{T_m} \rangle \right|^2$$

Next the Taylor expansion may be applied to the $e^{\pm \tilde{Z}_{T^m}}$ in $$e^{\tilde{Z}_{T_m}} \tilde{D}_{\alpha'}^\dagger e^{-\tilde{Z}_{T_m}} H$$

up to the first order in $\tilde{Z}_{T_m}$ to obtain:

$$\left| \langle \Psi_{ansatz}^{T_m} | e^{\tilde{Z}_{T_m}} \tilde{D}_{\alpha'}^\dagger e^{-\tilde{Z}_{T_m}} H | \Psi_{ansatz}^{T_m} \rangle \right|^2 = \tag{21}$$

$$\left| \langle \Psi_{ansatz}^{T_m} | (1 + \tilde{Z}_{T_m} + \dots) \tilde{D}_{\alpha'}^\dagger (1 - \tilde{Z}_{T_m} + \dots) H | \Psi_{ansatz}^{T_m} \rangle \right|^2 \approx$$

$$\left| \langle \Psi_{ansatz}^{T_m} | \tilde{D}_{\alpha'}^\dagger H - \tilde{D}_{\alpha'}^\dagger \tilde{Z}_{T_m} H + \tilde{Z}_{T_m} \tilde{D}_{\alpha'}^\dagger H | \Psi_{ansatz}^{T_m} \rangle \right|^2.$$

The energy correction to the VQE may be obtained using equations (18) and (21).

The term $\tilde{D}^\dagger H - \tilde{D}^\dagger \tilde{Z} H + \tilde{Z} \tilde{D}^\dagger H$ in a suitably transformed space from Fermion to qubit basis is a sum of products of Pauli operators $$\sum_j \epsilon_j \hat{\sigma}^{(j)}.$$

Since $\hat{\sigma}^{(j)}$ have eigenvalues $+1$ or $-1$, denoting $|\Psi_j^{(p)}\rangle$ and $|\Psi_j^{(m)}\rangle$ as the eigenvectors with the respective eigenvalues, equation (21) may be rewritten as:

$$\left| \langle \Psi_{ansatz}^{T_m} | \sum_j \epsilon_j \hat{\sigma}^{(j)} | \Psi_{ansatz}^{T_m} \rangle \right|^2 == \tag{22}$$

$$\left| \langle \Psi_{ansatz}^{T_m} | \sum_j \epsilon_j \left( \sum_p | \Psi_j^{(p)} \rangle \langle \Psi_j^{(p)} | - \sum_m | \Psi_j^{(m)} \rangle \langle \Psi_j^{(m)} | \right) | \Psi_{ansatz}^{T_m} \rangle \right|^2 =$$

$$\left| \sum_j \epsilon_j \left( \sum_p | \langle \Psi_{ansatz}^{T_m} | \psi_j^{(p)} \rangle |^2 - \sum_m | \langle \Psi_{ansatz}^{T_m} | \psi_j^{(m)} \rangle |^2 \right) \right|^2.$$

In some implementations, equation (22) may utilize a projection of $|\Psi_{ansatz}\rangle$ onto $|\Psi_j^{(p)}\rangle$ or $|\Psi_j^{(m)}\rangle$. The second order correction energy may be obtained without any quantum resource overhead in the circuit size. A wavefunction correction may be used to optimize the choice of the ansatz evolution operator in the next cycle. The ansatz state wavefunction may be considered as the zeroth-order wavefunction $|\Psi^{(o)}\rangle$ and the first order wavefunction correction may be given by $$|\Psi_{T_m}^{(1)}\rangle = \sum_{\{\alpha'\}} \frac{\langle \Psi_{D_{\alpha'}} | V_{T_m} | \Psi_0 \rangle}{\Delta E_{D_{\alpha'}}} |\Psi_{D_{\alpha'}}\rangle. \tag{23}$$

In some aspects, the following aspects of the present disclosure may be used to determine which ansatz evolution operator to use next in the (m+1)th round. After variationally determining a set of values for the parameters in the set $T_m$ (denoted as $S_m$) in the mth round, the method may search for a set $R_m = \{U_{T_i}\}$ of the evolution operators $U_{T_i}$ that satisfy $T_m \subset T_i$ and $n(T_i \backslash T_m) = \min_{j \neq m}[n(T_j \backslash T_m)]$, where $n(A)$ denotes the number of elements in set A. $R_m$ may be the pool of operators that may be chosen for the next ansatz evolution operator. For each $U_{T_i}$ in $R_m$, the overlap may be computed as $F_m^i = \Sigma_{t_\beta \in T_i + T_m} | \langle \Psi_{t_\beta}^{m,i} | \psi_{T_m}^{(1)} \rangle |$, where $$| \Psi_{t_\beta}^{m,i} \rangle = \left( \frac{\partial U_{T_i}}{\partial t_\beta} | S_m \right) | \Psi_0 \rangle. \tag{24}$$

Using the identity $| \langle \Psi_{D_\alpha} | \Psi_{D_{\alpha'}} \rangle | = \delta_{\alpha\alpha'}$, the $F_m^i$ values may be evaluated based on equations (18), (21), and (24). The $U_{T_i}$ selected from $R_m$ with the largest $F_m^i$ may be used as the ansatz evolution operator in the next cycle. In some implementations, the wavefunction correction may be used to guess the initial values for an additional variational parameter $t_\beta \in T_{m+1} \backslash T_m$ as $\langle \Psi_{t_\beta}^{m,m+1} | \psi_{T_m}^{(1)} \rangle$.

In the case of UCCSD, each $U_{T_i}$ in $R_m$ may have one more $D_\alpha$ term in $Z_{T_i}$ than $Z_{T_m}$ of $U_{T_m}$, which corresponds to an incremental change in the terms included in the ansatz operator Z. Using $e^{Z_{T_i}} \approx 1 + \tilde{Z}_{T_i}$, $F_m^i$ may be approximately the perturbative amplitude $$\frac{\langle \Psi_{D_{\alpha'}} | V_{T_m} | \Psi_0 \rangle}{\Delta E_{D_\alpha}}$$

of the corresponding additional $D_\alpha$.

In some aspects, the procedures introduced above for the mth round of VQE cycle may also be used before the first cycle by taking m=0. In such a case, the calculations may be classical and the energy correction may be the MP2 energy correction. The wavefunction correction may inform the first operator to be tried and suggest the initial values for the corresponding variational parameters.

The number of individual Pauli string operators (e.g., in equation (22)) whose expectation values are to be evaluated using a quantum computer scales is $O(n^8)$ per UCCSD ansatz, where n is the number of qubits. Here, for a fixed ansatz, Z may be fixed, and equation (21) may require $O(n^8)$ Pauli string measurements, $O(n^4)$ from $\tilde{D}_{\alpha'}$, and another $O(n^4)$ from H. While the scaling may appear challenging, in practice, some aspects of the present disclosure may be applied to reduce the number of evaluations as described below.

One aspect of the present disclosure includes the selection of qubits. Since only the qubits that are coupled via a chosen ansatz are entangled, some qubits may be used to create the ansatz state and some qubits may operate classically. In another aspect, an extension to small, disjoint sets of qubits with set sizes that admit inexpensive classical post-processing may be utilized. In some implementations, if there are two qubits that represent the same spatial orbital with two opposite spins, in the case where they are not distinguishable in their energy due to a particular choice of the ansatz, the two qubits may encode redundant information. This may allow for the encoding of the information using just one qubit.

An aspect of the present disclosure includes measuring multiple Pauli strings simultaneously and/or contemporaneously to reduce the total number of measurements provided that the Pauli strings commute with each other. Methods of measurement may include the general commuting (GC) partition and the qubit-wise commuting (QWC) partition methods. GC partition may reduce the number measurements and incur additional cost of additional two-qubit gates. QWC partition may reduce the number of measurements (to a lesser degree than GC partition) without increasing the number of two-qubit gates. In some aspects, QSR may be implemented before GC to reduce the additional two-qubit gates.

Figure 7:
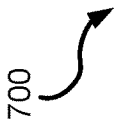
FIG. 7 is an example of a chart comparing of the ground state energies of a water molecule at its equilibrium geometry using STO-3G basis set, calculated by various methods, according to some aspects of the present disclosure.

FIG. 7 illustrates an example of a graph 700 showing the convergence of the ground state energies using different approaches as the number of $D_\alpha$ terms N included in the UCCSD ansatz operator increases. The insertion order of the ansatz terms for the conventional curve shown here is obtained from the prior knowledge of the order of contribution of determinants in a classical FCI calculation, which closely mimics the ideal case but rarely realistic to obtain. Comparing the two convergence curves, the HMP2 assisted simulation captures the major ansatz terms. FIG. 7 shows good agreement between the FCI ordering and the HMP2 ordering. The HMP2 correction to the ground-state energy may help accelerate the energy convergence towards the FCI energy. Provided that implementation of each additional ansatz term leads to a substantial accumulation of noise in the noisy intermedium-scale quantum (NISQ) hardware, the rapid energy convergence enabled by the HMP2 method may be helpful for quantum computers.

In some instances, a variety of Fermion to qubit transformations may be used to reduce the quantum resource requirements for the pre-FT Fermion simulations. Well-known Fermion to qubit transformations, such as Jordan-Wigner (JW) or Bravyi-Kitaev (BK) transformations, map Fermionic creation (annihilation) operators to Pauli strings. However, there in principle exist numerous other transformations available for use, for example, a generalized transformation (GT) method, of which the JW and BK transformations are a part. When used with the PF algorithm as a concrete example for the implementation of the UCCSD ansatz, significant quantum resource savings may be achieved by a suitable choice of the mapping for a given cluster operator input, together with a carefully chosen sequence of heuristic optimization methods.

The transformations in the GT method may respect relations specified in equation (2). This may be achieved by considering the following invertible, upper-triangular basis-transformation matrix $\beta$, which transforms the occupation number basis to a GT basis according to:

$$\beta = \begin{pmatrix} \beta_{n-1,n-1} & \beta_{n-1,n-2} & \cdots & \beta_{n-1,0} \\ 0 & \beta_{n-2,n-2} & \cdots & \beta_{n-2,0} \\ \vdots & \vdots & & \vdots \\ 0 & 0 & \cdots & \beta_{0,0} \end{pmatrix},$$

where $\beta_{i,j} \in \{0,1\}$ for i>j, $\beta_{i,j}=1$, and n is the number of qubits involved in the transformation. The matrix operations are performed in modulo-2 space and main diagonal elements are excluded when generating the sets. The following sets of indices have been defined for convenience.

Update set U(j): elements of this set are the row indices with non-zero entries in column j of the basis-transformation matrix $\beta$.

Flip set F(j): elements of this set are the column indices with non-zero entries in row j of the inverse $\beta^{-1}$ of the basis-transformation matrix.

Parity set F(i): elements of this set are the column indices with non-zero entries in row j of the matrix $(\pi\beta^{-1}-\beta^{-1})$ where $\pi_{i,j}1$ if i≤j, otherwise 0.

Remainder set R(j): elements of this set are the column indices with non-zero entries in row j of the matrix $\pi\beta^{-1}$.

The GT-based creation and annihilation operators are then:

$$a_j^\dagger \equiv \frac{\left[\sigma_x^{U(j)} \otimes \sigma_x^j \otimes \sigma_z^{P(j)} - i\sigma_x^{U(j)} \otimes \sigma_y^j \otimes \sigma_z^{R(j)}\right]}{2}, \tag{25}$$

$$a_j^\dagger \equiv \frac{\left[\sigma_x^{U(j)} \otimes \sigma_x^j \otimes \sigma_z^{P(j)} + i\sigma_x^{U(j)} \otimes \sigma_y^j \otimes \sigma_z^{R(j)}\right]}{2},$$

which can be shown to satisfy equation (2). The JW transformation is a special case of $\beta=1$.

In certain implementations, the implementation of the UCCSD ansatz relies on the JW transformation and it considers a series of heuristics that were chosen carefully to optimize the resulting quantum circuits. Details of the heuristics considered are discussed below. The outline the steps in the order of applications are shown below.

The outer-most loop of the approach discussed above considers different transformation matrices $\beta$. For a given mapping matrix $\beta$, the following routines may be executed to construct and optimize the circuit that implements the UCCSD ansatz. The routines are designed to repeatedly call a suite of dedicated, automated circuit optimization tools. The efficiency of these tools may allow for quick evaluation of the cost function for different cases in each of the subroutines.

In an implementation, the first routine may be associated with Fermionic level labeling. Unlike in the JW transformation where U(j) is an empty set and P(j)=R(j), in the GT approach, myriads of combinations of sets U(j), P(j), and R(j) are possible. To take advantage of this, it may be desirable to carefully select which Fermion level is mapped onto which qubit index. Exploring all possible mapping is however computationally prohibitively expensive. Instead, a greedy approach may be utilized, whereby the routine explores one permutation at a time from a given Fermion-level to qubit-index mapping. Specifically, from the given mapping, the permutation that results in the most reduction in the quantum resource requirements is applied. This process may be iterated until no single permutation results in the reduction of quantum resource requirements. Subroutine below may illustrate the cost function evaluation for each permutation.

In some aspects, the first routine may reduce the number of two-qubit gates by exploiting different mappings from labels of Fermion levels to qubit indices. The Pauli strings for an excitation operator, after applying the Fermion $\rightarrow$ qubit transformation of choice, depends on the qubit index values. An optimized mapping from labels of Fermion levels to qubit indices a smaller number of two-qubit gates required. Such mapping may be equivalent to maintaining a simple mapping from any Fermion level k to qubit index k while rearranging the labeling of the Fermion levels (which may be arbitrary). The freedom of Fermion level labeling may be used to reduce the number of two-qubit gates for implementing the one- and/or two-body Trotter terms.

In some aspects, for an n-qubit system representing n Fermion levels, the greedy approach may be implemented. First, a set of unique permutation matrices $\{P_i\}$ for possible k-swap operations may be generated. Here, k-swap operations may include swapping k unique ordered pairs of indices $(2l_j, 2l_j+1)$ with k other unique ordered pairs of indices $(2m_j, 2m_j+1)$ with the same subscript index $j \in \{0, \ldots, k-1\}$ where $$l_j \in \left\{0, \, \ldots \, , \frac{n}{2} - 2\right\} \text{ and } m_j \in \left\{l_j + 1, \, \ldots \, , \frac{n}{2} - 1\right\}.$$

An example value of k may be 2, 5, 10, 20, etc. Next, by denoting the initial Fermion labels as a column vector $L_0$, an aspect of the present disclosure may include going through some or all the permutation matrices in the first round and compute the number of two-qubit gates that corresponds to each instance of relabeled Fermion levels $P_i L_0$ by adding the number of two-qubit gates for each excitation term obtained from the intra-Trotter term reordering subroutine discussed later. When traversing through the permutation matrices, if any matrix results in a lower two-qubit gate count than any or all of the previous matrices, the two-qubit gate count may be recorded as $N_1$ and the corresponding relabeled level vector as $L_1$. Next, an aspect of the present disclosure may proceed the greedy approach iteratively following the first round. Denoting the resulting relabeled Fermion level vector from the mth round as $L_m$ and the corresponding two-qubit gate count as $N_m$, an aspect of the present disclosure may include traversing through some or all the permutation matrices and compute the corresponding two-qubit gate counts for each instance of relabeled levels $P_i L_m$. Taking $N_{m+1} = N_m$ initially, when a matrix results in a two-qubit counter lower than $N_{m+1}$, the gate count is recorded as $N_{m+1}$ and the matrix as $L_{m+1}$. If there is not any matrix that results in a lower two-qubit count than $N_m$, the iteration may be terminated and $L_m$ may be returned as the optimal labeling. Otherwise, the routine proceeds to the next round.

In some instances, once the labels are determined, they are applied to the relevant Fermionic operators, including the molecular Hamiltonian, for maintaining consistency during simulation.

In a different implementation, the second routine may be associated with Inter-Trotter term ordering. The ordering of the Trotter terms appropriately may lead to large savings in the two-qubit gate counts due to gate cancellations between the neighboring Trotter term circuits. While a similar approach may be possible, in the GT approach, a non-trivial modification may be used. Specifically, each Trotter terms may be processed to determine their eligibility for being classified under the same equivalence class, the elements of which have the opportunities for resource savings when placed next to one another on a quantum circuit via the aforementioned gate cancellations. Once the equivalence classes according to the eligibility of each Trotter terms are determined, a simple greedy approach may be used to order the Trotter-term elements of each equivalence classes to reduce the two-qubit gate counts.

In some aspects of the present disclosure, a subroutine may be associated with inter-Trotter term ordering. In this subroutine (also known as the second routine) a heuristic may be used to reduce the number of two-qubit gates by taking advantage of the freedom to arbitrarily order the Trotter terms. Any orderings respect the error bound provided by PF algorithm. In an aspect of the present disclosure, a preprocessing step is run based on the information passed from the intra-Trotter term optimization step described below. Specifically, for operators $\alpha_i^\dagger \alpha_j$ and $\alpha_i^\dagger \alpha_j \alpha_k \alpha_l$, the subroutine checks if any one of the indices i and j for the former, and i, j, k, and l for the latter, may or may not be used as a target qubit in the circuit implementation of the operators in the standard compilation. Qubit indices unusable as a target are flagged as ineligible.

In one instance, after determining the ineligibilities, the subroutine proceeds according to the greedy approach. The subroutine identifies the most frequently eligible index (e.g., p) across all terms. Then, the terms with the index p are grouped as an eligible target qubit and classify them under the equivalence class [p]. Next, all the group elements from the list of one- and two-body operators are removed. The procedure is repeated until no more operators are left in the list.

In some aspects of the present disclosure, the quantum resource cost reduction may result in between the circuit representation of the elements of the same equivalence class, since the target qubit of the two-qubit gates from each element of the same class is the same. Once some or all the equivalence classes are specified, the subroutine permutes the orderings by which the elements are implemented on a quantum circuit. Since considering all permutations may be prohibitively expensive, the subroutine may implement the greedy approach by starting out with two of the elements that result in the most resource cost reduction. Next, the subroutine concatenates a next element, identified from the set of elements that have not been implemented in the circuit, based on the resource cost reduction. The concatenation process is repeated until no more element is left in the set. In some instances, each trial of testing out which element may be the best for the given iteration may include four cases. The circuit concatenation may be performed as a prefix or suffix, and the element to be concatenated may be considered in its original intra-term order or the reverse.

In some instances, a subroutine may be associated with Intra-Trotter term ordering. For a given Fermion-label to qubit-index mapping, an efficient method to implement a single- or a double-Fermion excitation Trotter term in the case where the JW transformation may be used. The method may include optimizing circuit construction that leverages full qubit-to-qubit connectivity. The method relies on a careful ordering of the intra-Trotter operator implementation, where, for instance, an example double-Fermion Trotter term $$e^{t_{pqrs}\left(a_p^\dagger a_q^\dagger a_r a_s - h.c\right)}$$

is expanded to $\sigma_{x,y,z}$-based intra-Trotter terms.

To enable an efficient implementation in other transformations used in our GT approach, the cost function for every possible permutations of the intra-Trotter terms may be computed.

In one aspect, the intra-Trotter subroutine may reduce the number of two-qubit gates by optimizing the ordering of the Pauli strings transformed form a two-body operator. Each one-body term may lead to one ordering, up to inversion because it contains two Pauli strings. Therefore, the one-body term does not require a specific ordering. For two-body operators, after applying proper transformation and PF algorithm, may contain eight subterms:

$$U^{two-body} = \prod_{j=0}^{7} e^{-i\theta \otimes_\nu \sigma^{(j,\nu)}/2}, \tag{26}$$

where j denotes the intra-Trotter term index, $\nu$ denotes the qubit index, and $\sigma \in \{1, \sigma_x, \sigma_y, \sigma_z\}$. Each of the intra-Trotter term $$e^{-i\theta \otimes_v \sigma^{(j,v)}/2}$$

may be translated into a standard circuit. In one implementation of U that uses an arbitrary Fermion to qubit transformation, each intra-Trotter term may result in $2(N_j-1)$ number of CNOT gates, where $N_j$ is the number of non-identity $\sigma^{(j,v)}$ in the jth Pauli string. In the JW transformation, any choice of t such that $\sigma^{(j,t)}$ are either $\sigma_x$ or $\sigma_y$, i.e., the qubits that correspond to the Fermion labels in the two-body term are good choices. If $\sigma^{(j,t)}=1$ in any one of the eight Pauli strings in U above, the intended target qubit index t may be unusable. Therefore, in the GT method, qubit choices t that lead to $\sigma^{(j,t)}=1$ may be removed from the set of eligible targets that start with all qubits that correspond to the Fermion labels that appear in the two-body term of interest and will subsequently not be used in the inter-Trotter term reordering subroutine described previously.

Figure 8:
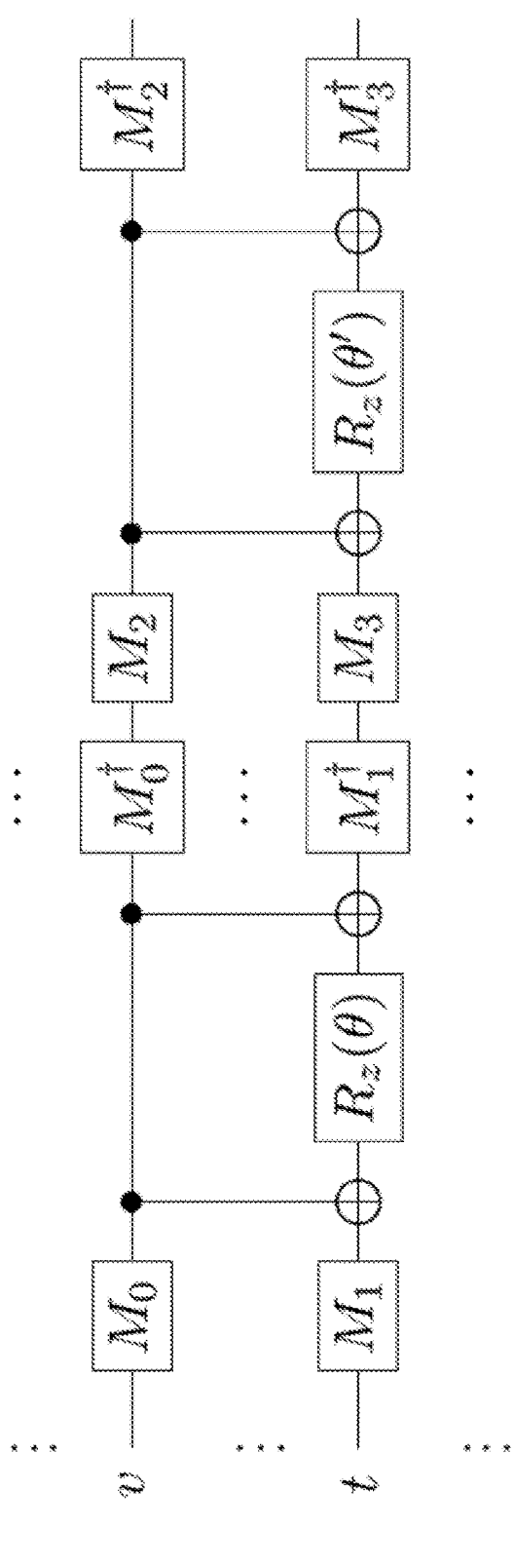
FIG. 8 is an example of a circuit for adjacent Pauli string circuits according to some aspects of the present disclosure.

In certain implementations, for a chosen target qubit of choice t, the reordering of intra-Trotter terms may maximize the CNOT reduction (e.g., CNOT reduction between adjacent Pauli string circuits). For each of the adjacent intra-Trotter terms, i.e., $$e^{-i\theta \otimes_v \sigma^{(j,v)}/2} \text{ and } e^{-i\theta' \otimes_v \sigma^{(j+1,v)}/2},$$

where $j \in [0,6]$, v may be enumerated through all non-target qubits. By comparing $\sigma^{(j,v)}$ and $\sigma^{(j+1,v)}$, for a particular control qubit v, if neither of the two Pauli matrices $\sigma^{(j,v)}$ and $\sigma^{(j+1,v)}$ is 1, then the circuit may be expressed as a circuit 800 shown in FIG. 8. In the circuit 800, t denotes the target qubit, v denotes the control qubit, $\sigma_l \in \{\sigma_x, \sigma_y, \sigma_z\}$, and $M_l \in \{H, S^\dagger H, 1\}$. If $\sigma_l=\sigma_x$, $M_l=H$. If $\sigma_l=\sigma_y$, $M_l=S^\dagger H$. If $\sigma_l=\sigma_z$, $M_l=1$.

In some instances, if the circuit 900, if $M_0=M_2$, there is a two CNOT reduction. If $M_0 \neq M_2$, there is a one CNOT reduction. Assuming there are $m_j^{(t)}$ two-CNOT reductions and $n_j^{(t)}$ one-CNOT reductions for the chosen target qubit t. Then, the total number of CNOT reduction is $2m_j^{(t)}+n_j^{(t)}$ for the target qubit of choice t. The total optimized number of CNOTs for a chosen target t of a certain ordering is $N^{(t)}=\Sigma_{j=0}^{7}2(N_j-1)-\Sigma_{j=0}^{6}2m_j^{(t)}+n_j^{(t)}$.

The resulting optimized circuit implements the UCCSD ansatz in the chosen transformation basis defined by $\beta$. However, with the exception of the JW transformation where $\beta=1$, the GT $\beta$ matrix requires the initial mapping of the basis at the beginning of the circuit. This incurs an overhead $$O\left(\frac{n^2}{\log(n)}\right)$$

in the two-qubit gate counts. To obtain the final quantum resource requirement, an automated optimizer may be called with the input quantum circuit that includes of the prefix subcircuit that implements $\beta$ and the postfix subcircuit that implements $\beta$-basis UCCSD ansatz.

Effectively, in the JW transformation, whenever a pair of neighboring qubits, whichever appropriate Fermion levels they correspond to, are excited to yet another pair of neighboring qubits that denote another set of Fermion levels, the circuit that implements such an excitation term may sometimes be simplified to require only two two-qubit gates, while requiring only half the number of qubits that would otherwise be required. To take advantage of this, a juxtaposition the Bosonic circuit written according to the JW transformation and non-Bosonic circuit written according to the GT approach may be utilized. When returning from the half-qubit space of the Bosonic circuit to the full-qubit space of the non-Bosonic circuit, $$\frac{n}{2}CNOT$$

gates may be expended.

In some implementations, the correspondence between Generalized Bosonic terms and Fermionic terms may be established. A Fermionic double excitation term $\theta_{pqrs}$ $(\alpha_p^\dagger \alpha_q^\dagger \alpha_r \alpha_s - h.c.)$, when transformed by the JW transformation, turns into $\theta_{pqrs}(\sigma_+^p \sigma_+^q \sigma_-^r \sigma_-^s \otimes_k \sigma_z^k - h.c.)$. If p and q belong to the same spatial orbital, and r and s belong to another same spatial orbital, assuming no other terms that break the symmetry between p and q or r and s, have been considered in the circuit, p and q levels may be encoded by a single qubit and r and s may be encoded by a single qubit. As such, using p and r as representatives, the qubit-space operator may be simplified to $\theta_{pqrs}(\sigma_+^p \sigma_-^4 \otimes_k \sigma_z^{k'} - h.c.)$, where k' runs over the set of qubits $\sigma_z$ operator needs to be applied for the given excitation term in the appropriately reduced space. The appropriately reduced space may include the single qubits that each denotes the reduced, symmetric levels and those that are not reduced. For example, if two of the levels $k_1$ and $k_2$ in the original space require $\sigma_z$ and if $k_1$ and $k_2$ are encoded into a single index k', $\sigma_z^{k'}$ may be called twice (once for $k_1$ and once for $k_2$). This may be identity, which results in resource savings.

Table II shows circuit metrics, measured according to the number of two-qubit gates used to implement a UCCSD ansatz circuit for different molecules, for the JW, BK, and the best GT transformations that the heuristic toolchain specified above found. To find the best GT transformations, a particle swarm optimization may be used. The advantages offered by the GT transformations vary in the suite of molecules, ranging from 1.44% to 21.43%. This demonstrates the capability of the heuristics that it is indeed possible to further optimize the quantum circuits obtained via the JW transformation by considering GT transformations, custom selected for different input cases. The low reduction rate may be due to the inability of the classical optimization to sample enough matrices using limited classical computational resources.

TABLE II

Number of two-qubit gates required for the VQE simulation of different molecules with different fermion to qubit transformations. n is the dimension of the $\beta$ matrix. NE is the number of excitation terms considered in the UCCSD ansatz. JW/BK are the number of two-qubit gates with JW or BK transformations. GT is the number of two-qubit gates given by the best $\beta$ other than JW or BK. All molecules use the STO-3G basis, and ansatz terms are determined according to the HMP2 ordering. (Top): Here, we report the results for the cases where the HMP2 method was used to reach chemical accuracy. (Bottom): Here, we report the results for the HMP2 progression for a water molecule. The number in the parentheses next to $H_2O$ indicates the total number of excitation terms ($D\alpha$) considered for the UCCSD ansatz.

| Molecule | n | NE | JW | BK | GT | Improve(%) |
|----------|---|----|----|----|----|-----------|
| HF | 6 | 3 | 30 | 29 | 25 | 16.67 |
| LiH | 6 | 3 | 30 | 29 | 25 | 16.67 |
| $BeH_2$ | 8 | 9 | 70 | 71 | 60 | 14.29 |

TABLE II-continued

Number of two-qubit gates required for the VQE simulation of different
molecules with different fermion to qubit transformations. n
is the dimension of the β matrix. NE is the number of excitation
terms considered in the UCCSD ansatz. JW/BK are the number of
two-qubit gates with JW or BK transformations. GT is the number
of two-qubit gates given by the best β other than JW or
BK. All molecules use the STO-3G basis, and ansatz terms are determined
according to the HMP2 ordering. (Top): Here, we report the results for
the cases where the HMP2 method was used to reach chemical accuracy.
(Bottom): Here, we report the results for the HMP2 progression for a
water molecule. The number in the parentheses next to H₂O indicates
the total number of excitation terms (Dα) considered for the
UCCSD ansatz.

| Molecule | n | NE | JW | BK | GT | Improve(%) |
|---|---|---|---|---|---|---|
| NH₃ | 14 | 52 | 485 | 607 | 478 | 1.44 |
| H₂O(4) | 8 | 4 | 42 | 50 | 35 | 21.43 |
| H₂O(5) | 8 | 5 | 44 | 52 | 37 | 20.45 |
| H₂O(6) | 8 | 6 | 46 | 47 | 39 | 19.56 |
| H₂O(8) | 10 | 8 | 68 | 88 | 63 | 7.35 |
| H₂O(9) | 10 | 9 | 71 | 89 | 66 | 7.04 |
| H₂O(11) | 10 | 11 | 93 | 96 | 87 | 6.45 |
| H₂O(12) | 10 | 12 | 95 | 112 | 89 | 6.32 |
| H₂O(14) | 10 | 14 | 116 | 140 | 112 | 3.45 |
| H₂O(16) | 10 | 16 | 137 | 166 | 133 | 2.92 |
| H₂O(17) | 10 | 17 | 139 | 168 | 135 | 2.88 |

In some examples, a parallel implementation of multiple Trotter terms may be considered in the $R_z$ gate depth reduction of the quantum simulation circuits. Based on the circuit construction discussed above, the methodology for optimization over the parallel implementation may be contemplated.

As discussed above, note that the circuit that implements the Trotter term includes largely of three parts: an initial CNOT gate network that computes a linear function of Boolean input variables, a triply-controlled $R_x$ gate, and the inverse of the initial CNOT gate network. Denoting the Boolean variables at the input as, in the order from top to bottom, a, b, c, and d, the CNOT gate network outputs a, b⊕c, a⊕c, and a⊕d. The bottom three outputs remain invariant over the action of the triply-controlled $R_x$ gate. This means that any linear functions of b⊕c, a⊕c, and a⊕d are accessible for use in the implementation of CNOT gates that correspond to the JW $\sigma_z$ strings for other Trotter terms. This is so, because the invariance is required to implement the appropriate inverse of the CNOT gates that were used to take the JW $\sigma_z$ strings into consideration in the first place, as per the circuit construction shown in FIG. 4. Heuristic methods that collect those Trotter terms and simultaneously implement them can then be used to optimize the depth of the quantum circuit.

For the pre-FT regime VQE simulations, an aspect of the present disclosure includes a general framework that leverages the predictive and corrective power of perturbation theory. In an aspect, in addition to the HMP2 method described here, many more complex forms of perturbation theory may also be used to improve the efficiency and accuracy of the simulations. For instance, it is possible to obtain the coefficients for ansatz terms, possibly including triple or higher excitation terms perturbatively similar to the way classical CCSD(T) or CCSDT-1a/b methods include triple excitation terms. The methods described above are general enough that other perturbation methods may replace the HMP2 methods within the perturbation assisted quantum simulated cycle.

In certain implementations, when extending and generalizing the framework used for considering the Bosonic terms in the JW transformation and the non-Bosonic terms in the GT transformation, the use of multiple Fermion to qubit transformations β for a given set of excitation terms may be of value in reducing the overall resource requirement. Drawing from the fact that different β transformations result in different resource requirements in implementing the excitation terms of a target UCCSD ansatz circuit, it is possible to expect that a certain subset of the excitation terms may be more efficiently implemented by one β transformation and some other excitation terms may be implemented more efficiently by yet another β transformation. Thus, dividing the set of excitation terms required for preparing a UCCSD ansatz state into subsets of excitation terms that may be more efficiently implemented by respective, appropriate choices of β transformations for each of the subset may prove to be more advantageous in the quantum resource requirement. Optimizing over the tug of war expected between the overhead cost incurred due to the switching of the transformations and the savings obtained via the tailor-made choices of the transformations may be possible without deviating from the spirit of the current application.

In another aspect of the present disclosure, a procedure for using binary particle swarm optimization (PSO) may be implemented to optimize the binary matrix β for GT. To encode the problem, the upper triangular entries in an n×n binary matrix β may be mapped to a one dimensional binary vector $X \in \{0,1\}^d$ where the size $$d = \frac{n(n-1)}{2}.$$

Vector X may function as the location vector for PSO. The cost function for PSO at a location X mapped from a β matrix may be defined as the number of two-qubit gates needed to implement a UCCSD evolution operator using GT with the β matrix and subsequently a series of heuristics.

An aspect of the present disclosure starts by creating a swarm of particles, each with an initial location $X^i(t=0)$ mapped from a β matrix sampled from the set of upper triangular matrices whose diagonal elements are ones and off-diagonal elements are zeros except for k of them. Non-negative integer t represents the time step and t=0 may be the beginning of the optimization. The total number of particles in the swarm may be $$\sum_{j=1}^{k} \binom{d}{j}$$

where $$\binom{\cdot}{\cdot}$$

denotes a binomial coefficient. Specifically, k may vary from 1 to $k_{max}=6$ for n≤8 and $k_{max}=3$ for the rest of the cases. Each particles may have a velocity vector $V^i(t)$ of the same dimension as $X^i(t)$. The initial matrix elements of the velocity vectors may be set to zero.

At any or every time step t, the procedure may track a local optimal location vector $L^i(t)$ and the corresponding local optimal cost $s^i(t)$ for each particle i and a global optimal location vector G(t). The local optimal location vector $L^i(t)$ may be defined as the location vector with the lowest cost function value $s^i(t)$ across all the locations particles i has traveled to up to the time step t. The global location vector is the $L^i(t)$ with the lowest $s^i(t)$ among all the particles. The velocity vectors are updated from the tth step to the (t+1)th step according to:

$$V_j^i(t+1)=wV_j^i(t)+C_1(L_j^i(t)-X_j^i(t))+C_2(G_j(t)-X_j^i(t)) \qquad (27)$$

where w is the inertia parameter, $c_1$ is the cognitive parameter, and $c_2$ is the social parameter. In some examples, various parameters may be used, such as $w \in [-4,4]$, $c_1 \in [0,2]$, and $c_2 \in [0,2]$. The subscript j denotes the jth element of the corresponding vectors. The elements of the location vectors $X_j^i(t+1)$ are then updated to 0 if rand( )$\leq 1/[1+e^{-V_j^i(t+1)}]$ or 1 otherwise. Here, rand( ) may be a real quasirandom number generating function that samples from the uniform distribution on [0.0,1.0].

The optimization may continue until t reaches $t_{max}$ or each location vector oscillates between two vectors for more than $\partial t_{osc}$ times. Then the global optimal location vector is used to map back to an optimal $\beta$ matrix. In one example, $\partial t_{osc}=10$, $t_{max}=10000$ for $n\leq 8$, and $t_{max}=100$ for other cases. In other examples, the choice of $t_{max}$ may be sufficient large such that the optimization begins to oscillate before t reaches $t_{max}$.

Examples of GT results using binary PSO may be represented based on the fractional improvements in two-qubit gate count, $\rho$, defined according to:

$$\rho = \frac{f_{GT}(R)}{f_{GT}(R) - f_{JW}} \qquad (28)$$

where $f_{GT}$ and $f_{JW}$ may be the numbers of two-qubit gates for implementing a UCCSD evolution operator using GT with binary PSO, or JW, respectively. $f_{GT}$ depends on the classical computing resources used by binary PSO which are determined mostly by the number of particles used since $t_{max}$ may be set to be sufficiently large. To contrast the amount of classical computing resource resources used with what is maximally possibly needed, a fractional classical computing resource metric as the ratio between the number of particles used, N, and the total number of possible variations of the $\beta$ matrices, which may be written as:

$$R = \frac{N}{2^{n(n-1)/2}} \qquad (29)$$

where n is the number of diagonal elements of the $\beta$ matrices. Since the number of particles increase with k as discussed above, k may be changed to effectively change the amount of classical computing resources used for binary PSO.

In one aspect of the present disclosure, a circuit optimization technique may include implementing the first routine associated with Fermionic level labeling.

In a different aspect, a circuit optimization technique may include implementing the subroutine associated with inter-Trotter term ordering.

In some aspects, a circuit optimization technique may include implementing the subroutine associated with intra-Trotter term ordering.

In certain aspects of the present disclosure, one or more optimization techniques may be implemented. For example, a circuit optimization technique may include implementing the Fermionic level labeling routine and the inter-Trotter term ordering subroutine. In another example, a circuit optimization technique may include implementing the Fermionic level labeling routine and the intra-Trotter term ordering subroutine. In yet another example, a circuit optimization technique may include implementing the inter-Trotter term ordering subroutine and the intra-Trotter term ordering subroutine. In some examples, a circuit optimization technique may include implementing the Fermionic level labeling routine, the inter-Trotter term ordering subroutine, and the intra-Trotter term ordering subroutine.

Figure 9:
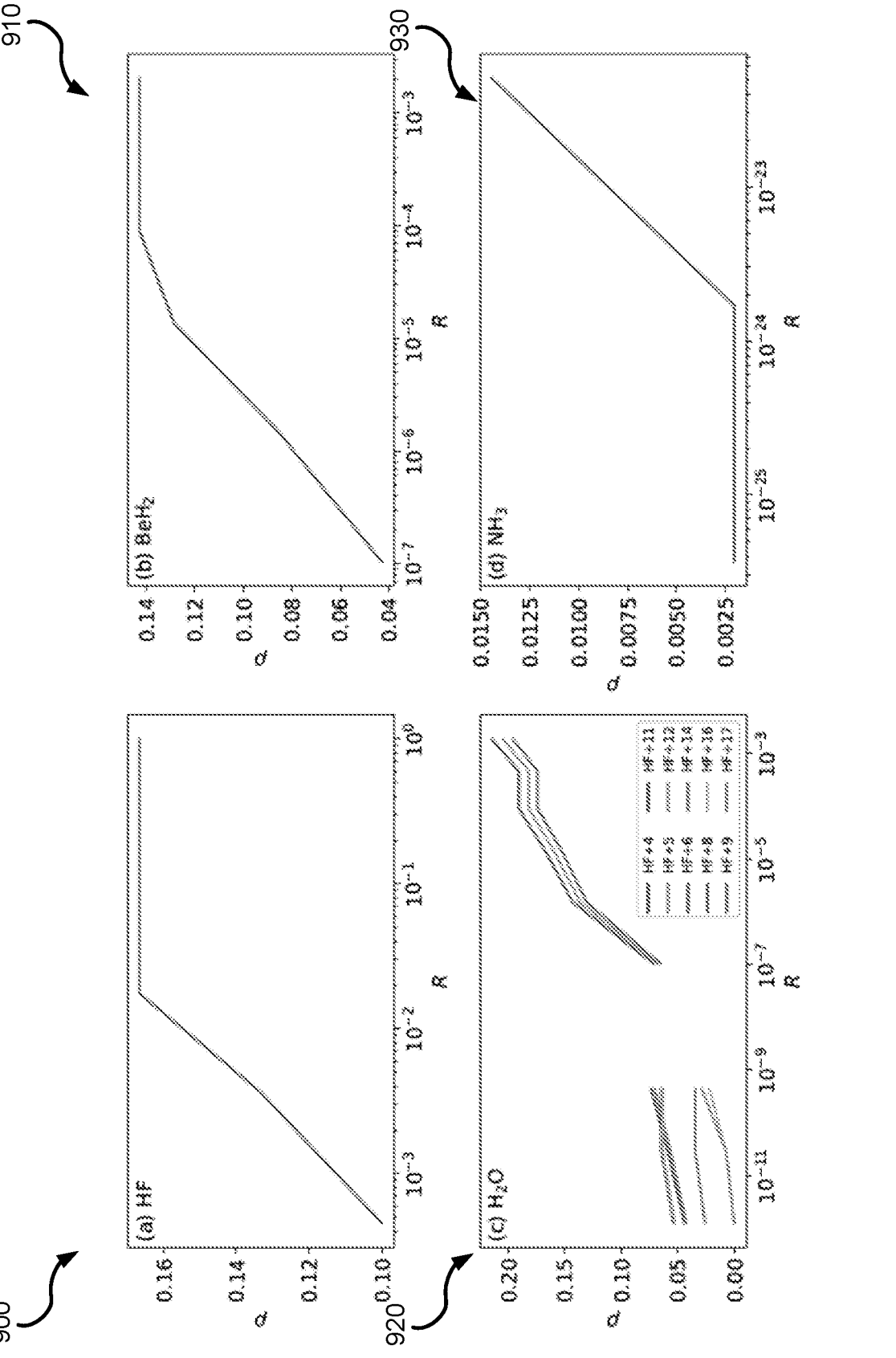
FIG. 9 illustrates examples of diagrams of fractional improvements according to some aspects of the present disclosure.

FIG. 9 shows simulation diagrams 900, 910, 920, 930 of fractional improvement $\rho$ as a function of the fractional classical computing resources used, R, for binary PSO. The first simulation diagram 900 is associated with hydrogen fluoride (HF). The second simulation diagram 910 is associated with beryllium hydride ($BeH_2$). The third simulation diagram 920 is associated with water ($H_2O$). The fourth simulation diagram 930 is associated with ammonia ($NH_3$). Different numbers of ansatz term may be used for the simulation diagrams (e.g., 4-6 ansatz terms). The simulations are performed with STO-3G basis set using the HMP2 method with UCCSD ansatz. For HF, $BeH_2$, and $NH_3$, the number of excitation terms included in the final UCCSD ansatz operators are 3, 9, and 52, respectively. This may result in the respective ground state energy estimates within chemical accuracy from their know ground state energies. When the term n is small enough for exploring a relative large portion of the possible variations of $\beta$ matrices ($R>10^{-5}$). Improvements range from less than 14% to over 20%. Larger n may lead to less improvements.

In another aspect of the present disclosure, a procedure for the qubit space reduction (QSR) technique may be used to optimize the number of Pauli strings to be measured. In a first variation, the procedure may treat the qubits that are in classically accessible states classically. In a second variation, the procedure may take advantage of Bosonic states by expanding only a single qubit for the two spin orbitals in the same spatial orbital with degenerate energy due to a particular choice of ansatz.

For the first variation, in some instances, consider a Pauli string $S=A_0A_1 \ldots A_{n-1}$ to be measured, where $A_i \in \{\sigma_x, \sigma_y, \sigma_z, I\}$, and I is a two-by-two identity operator. Conjugating the above with a quantum state $|\Psi\rangle = |\psi\rangle |\phi\rangle$, where $|\psi\rangle$ denotes a quantum state of the qubits that are entangled due to the ansatz and $|\phi\rangle$ denotes a quantum state of the qubits that are in a classically accessible state (e.g., a computational basis state), the following equation may be written:

$$\langle\Psi|S|\Psi\rangle = \langle\psi|\langle\phi| \bigotimes_{i\in P} A_i \bigotimes_{j\in Q} A_j |\psi\rangle|\phi\rangle = \langle\psi| \bigotimes_{i\in P} A_i|\psi\rangle\langle\phi| \bigotimes_{j\in Q} A_j|\phi\rangle \qquad (30)$$

where sets P and Q denote the set of qubits that are entangled and the set of qubits that are in a classically accessible state, respectively. The second tensor product in equation (30) may be classically and/or efficiently computed. As a result, only the first tensor product in equation (30) may require a quantum computer, which leads to the reduction in the number of Pauli strings to measure.

An example of the implementation of the second variation is described below. A quantum state $|\psi\rangle$ may be defined as:

$$|\Psi\rangle = \Sigma_m |\psi_m\rangle (c_{m,o}|00\rangle + c_{m,1}|11\rangle). \qquad (31).$$

Since the separated-out, two-qubit states $|00\rangle$ and $|11\rangle$ do not encode any more than a single qubit of information, equation (31) may be compressed to:

$$|\Psi_{comp}\rangle = \Sigma_m |\psi_m\rangle (c_{m,o}|0\rangle + c_{m,1}|1\rangle) \qquad (32).$$

A Pauli string $S=A_0A_1 \ldots A_{n-1}$ may live in a full space spanned by $|\Psi\rangle$ in equation (31). Here, $A_0A_1$ may be the Pauli product that live in the separated-out two-qubit state space in equation (31). Conjugating $S$ and $|\Psi\rangle$, the following equation may be written:

$$\langle \Psi|S|\Psi \rangle = \Sigma_{m,n} \langle \psi_m|_{i>1} \otimes A_i|\psi_n \rangle (c^*_{m,0}c_{n,0}$$
$$\langle 00|A_0A_1|00 \rangle + c^*_{m,0}c_{n,1} \langle 00|A_0A_1|11 \rangle) +$$
$$(c^*_{m,1}c_{m,0} \langle 11|A_0A_1|00 \rangle + c^*_{m,1}c_{n,1} \langle 11|A_0$$
$$A_1|11 \rangle) \qquad (33).$$

A compressed Pauli string $S_{comp}=A_{comp}A_2 \ldots A_{n-1}$ may live in a full space spanned by $|\Psi_{comp}\rangle$ in equation (32). Conjugating $S$ and $|\Psi\rangle$, the following equation may be written:

$$\langle \Psi|S_{comp}|\Psi \rangle = \Sigma_{m,n} \langle \psi_m|_{i>1} \otimes A_i|\psi_n \rangle (c^*_{m,0}c_{n,0}$$
$$\langle 0|A_{comp}|0 \rangle + c^*_{m,0}c_{n,1} \langle 0|A_{comp}|1 \rangle) + (c^*_{m,1}c_{n,0}$$
$$\langle 1|A_{comp}|0 \rangle + c^*_{m,1}c_{n,1} \langle 1|A_{comp}|1 \rangle) \qquad (34).$$

Based on equations (33) and (34), the two equations may agree if the following conditions are satisfied $$\langle 00|A_0A_1|00 \rangle = \langle 0|A_{comp}|0 \rangle \qquad (35),$$

$$\langle 00|A_0A_1|11 \rangle = \langle 0|A_{comp}|1 \rangle \qquad (36),$$

$$\langle 11|A_0A_1|00 \rangle = \langle 1|A_{comp}|0 \rangle \qquad (37),$$

$$\langle 11|A_0A_1|11 \rangle = \langle 1|A_{comp}|1 \rangle \qquad (38).$$

For all possible $A_0$, and $A_1$, Table II below is the conversion table that lists the corresponding $A_{comp}$. Since many null matrices appear in Table II, in combination with the reduced set of operators to measure including the three single-qubit Pauli matrices and an identity matrix, measurement overhead may be reduced.

Figure 10:
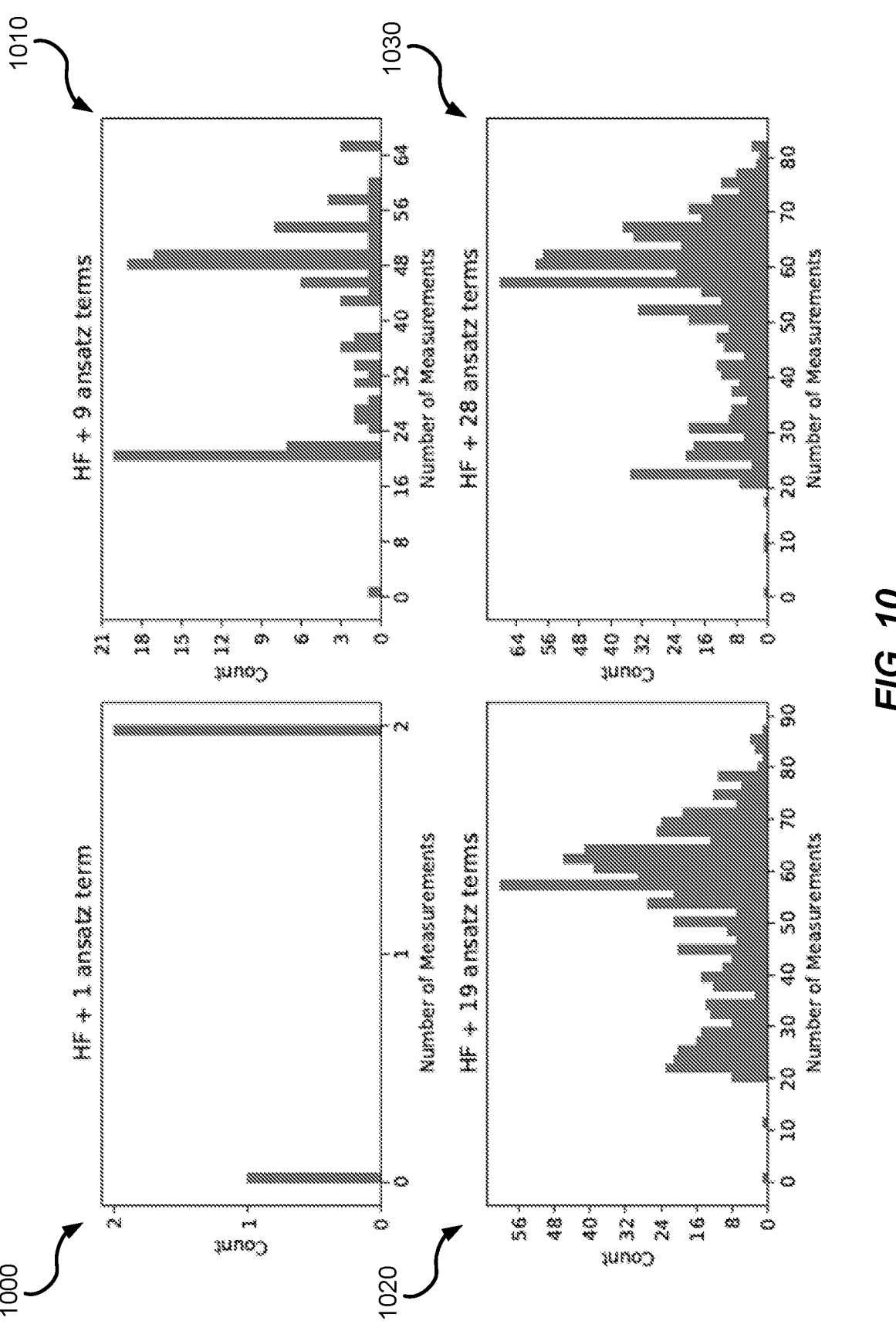
FIG. 10 illustrates examples of histograms of extra number of CNOT gates according to some aspects of the present disclosure.

Another aspect of the present disclosure includes the distribution of extra CNOTs when using GC with QSR. In GC, groups of multiple Pauli strings are created, which are drawn from the original set of strings required by a VQE simulation, and may be simultaneously measured. Each group may include a different number of extra CNOTs. Each group may require a different number of measurements, which may be smaller than the number of Pauli strings inside the group. FIG. 10 shows diagrams 1000, 1010, 1020, 1030 of the distributions of the numbers of extra CNOTs in the number of measurements for the GC method for a water molecule. The first diagram 1000 illustrates HF with one extra CNOT. The second diagram 1010 illustrates HF with 9 extra CNOTs. The third diagram 1020 illustrates HF with 19 extra CNOTs. The fourth diagram 1030 illustrates HF with 28 extra CNOTs. The number of extra CNOTs and the number of measurements to perform may increase as a function of a larger ansatz size.

Figure 11:
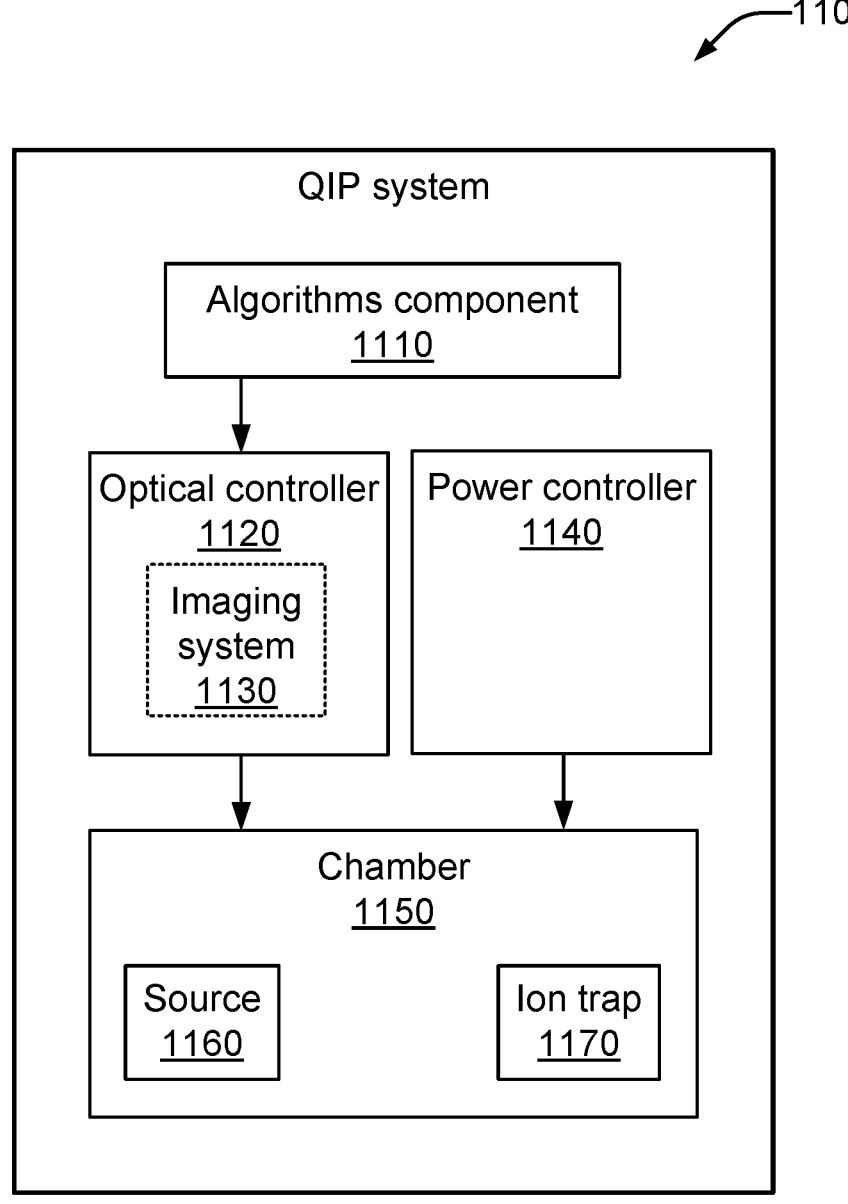
FIG. 11 is a block diagram that illustrates an example of a quantum information processing (QIP) system according to some aspects of the present disclosure.

FIG. 11 is a block diagram that illustrates an example of a QIP system 1100 in accordance with aspects of this disclosure. The QIP system 1100 may also be referred to as a quantum computing system, a computer device, a trapped ion system, or the like.

The QIP system 1100 can include a source 1160 that provides atomic species (e.g., a plume or flux of neutral atoms) to a chamber 1150 having an ion trap 1170 that traps the atomic species once ionized (e.g., photoionized). In one example, a power controller 1140 may supply the electrical energy used by the source 1160 to generate an atomic flux.

The imaging system 1130 can include a high resolution imager (e.g., CCD camera) for monitoring the atomic ions while they are being provided to the ion trap or after they have been provided to the ion trap 1170. In an aspect, the imaging system 1130 can be implemented separate from the optical controller 1120; however, the use of fluorescence to detect, identify, and label atomic ions using image processing algorithms may need to be coordinated with the optical controller 1120.

The QIP system 1100 may also include an algorithms component 1110 that may operate with other parts (not shown) of the QIP system 1100 to perform quantum algorithms or quantum operations, including a stack or sequence of combinations of single qubit operations and/or multi-qubit operations (e.g., two-qubit operations) as well as extended quantum computations. As such, the algorithms component 1110 may provide instructions to various components of the QIP system 1100 (e.g., to the optical controller 1120) to enable the implementation of the quantum algorithms or quantum operations.

Referring now to FIG. 12, illustrated is an example computer device 1200 in accordance with aspects of the disclosure. The computer device 1200 may represent a single computing device, multiple computing devices, or a distributed computing system, for example. The computer device 1200 may be configured as a quantum computer (e.g., a quantum information processing (QIP) system), a classical computer, or a combination of quantum and classical computing functions. For example, the computer device 1200 may be used to process information using quantum algorithms based on trapped ion technology and may therefore implement methods for performing, optimizing, compiling, and/or executing a quantum circuit as describe above. A generic example of the computer device 1200 as a QIP system that may implement the various techniques described herein is illustrated in an example shown in FIG. 11.

In one example, the computer device 1200 may include a processor 1210 for carrying out processing functions associated with one or more of the features described herein. The processor 1210 may include a single or multiple set of processors or multi-core processors. Moreover, the processor 1210 may be implemented as an integrated processing system and/or a distributed processing system. The processor 1210 may include a central processing unit (CPU), a quantum processing unit (QPU), a graphics processing unit (GPU), or combination of those types of processors. In one aspect, the processor 1210 may refer to a general processor of the computer device 1200, which may also include additional processors 1210 to perform more specific functions such as functions for individual beam control.

In an example, the computer device 1200 may include a memory 1220 for storing instructions executable by the processor 1210 for carrying out the functions described herein. In an implementation, for example, the memory 1220 may correspond to a computer-readable storage medium that stores code or instructions to perform one or more of the functions or operations described herein. In one aspect of the present disclosure, the memory 1220 may be a non-transitory computer-readable medium that stores code or instructions to perform one or more of the functions, techniques, and/or operations described herein. In one example, the memory 1220 may include instructions to perform aspects of methods in accordance with the present disclosures. Just like the processor 1210, the memory 1220 may refer to a general memory of the computer device 1200, which may also include additional memories 1220 to store instructions and/or data for more specific functions such as instructions and/or data for individual beam control.

Further, the computer device 1200 may include a communications component 1230 that provides for establishing and maintaining communications with one or more parties utilizing hardware, software, and services as described herein. The communications component 1230 may carry communications between components on the computer device 1200, as well as between the computer device 1200 and external devices, such as devices located across a communications network and/or devices serially or locally connected to computer device 1200. For example, the communications component 1230 may include one or more buses, and may further include transmit chain components and receive chain components associated with a transmitter and receiver, respectively, operable for interfacing with external devices.

Additionally, the computer device 1200 may include a data store 1240, which may be any suitable combination of hardware and/or software, that provides for mass storage of information, databases, and programs employed in connection with implementations described herein. For example, the data store 1240 may be a data repository for operating system 1260 (e.g., classical OS, or quantum OS). In one implementation, the data store 1240 may include the memory 1220.

The computer device 1200 may also include a user interface component 1250 operable to receive inputs from a user of the computer device 1200 and further operable to generate outputs for presentation to the user or to provide to a different system (directly or indirectly). The user interface component 1250 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 1250 may include one or more output devices, including but not limited to a display, a speaker, a haptic feedback mechanism, a printer, any other mechanism capable of presenting an output to a user, or any combination thereof.

In an implementation, the user interface component 1250 may transmit and/or receive messages corresponding to the operation of the operating system 1260. In addition, the processor 1210 may execute the operating system 1260 and/or applications or programs, and the memory 1220 or the data store 1240 may store them.

When the computer device 1200 is implemented as part of a cloud-based infrastructure solution, the user interface component 1250 may be used to allow a user of the cloud-based infrastructure solution to remotely interact with the computer device 1200.

In some implementations, the computer device 1200 may be implemented to perform classical computations, quantum computations, or both. The computer device 1200 may be implemented as a classical computer, a quantum computer, or a hybrid classical-quantum computer.

In one aspect of the present disclosure, the techniques described above may be performed by a quantum computer, a classical computer, or a hybrid classical-quantum computer. For example, the techniques for simulating a quantum circuit, optimizing a quantum circuit, compiling a quantum circuit, and/or executing a quantum circuit may be implemented by the computer device 1200.

In some aspects, the computer device 1200 and/or one or more of the subcomponents of the computer device 1200 may be configured to and/or define means for implementing the techniques described above.

Figure 13:
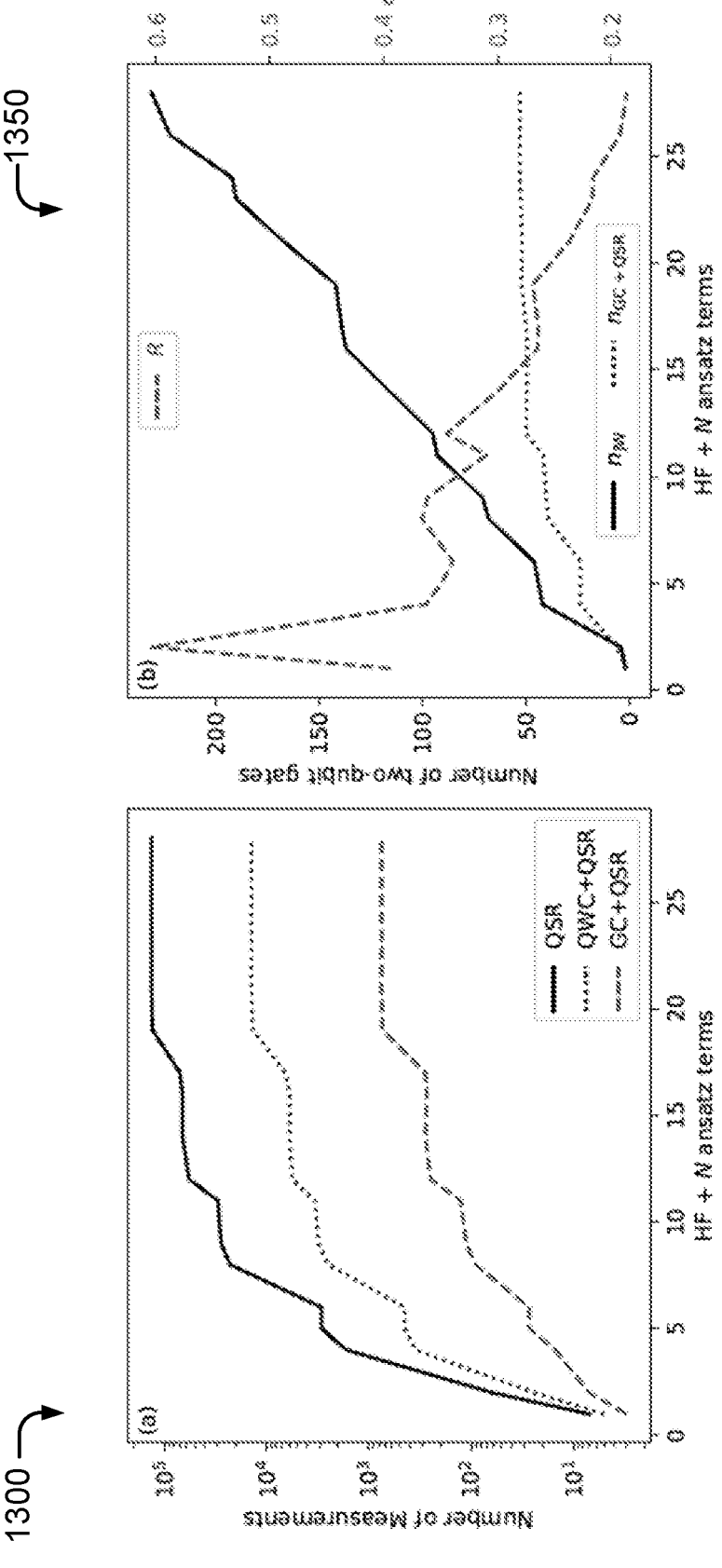
FIG. 13 illustrates examples of charts showing reduction of the number of measurements according to some aspects of the present disclosure.

FIG. 13 illustrates a chart 1300 showing the number of measurements for the water molecule using various optimization schemes described above. Comparing to the number of measurements optimized using only QSR, the number optimized using GC partition method and QSR is more than two orders of magnitude smaller while the number is about one order magnitude smaller using the QWC partition method along with QSR. A chart 1350 shows the additional cost in terms of the number of two-qubit gates associated with using the GC partition method along with QSR comparing to the total number of two-qubit gates using the JW transformation. The ratio between the two may reduce as the number of ansatz terms increases.

In some implementations, the calculations may be carried out using HMP2 framework with the UCCSD ansatz. The total number of measurements as a function of the number N of $D_\alpha$ terms in the UCCSD ansatz operator for a VQE cycle is shown in the chart 1300 for three different optimization schemes.

In some implementations, the average numbers of additional two-qubit gates incurred by using the GC partition along with QSR, $n_{GC+QSR}$, is shown in the chart 1350. The chart 1350 also shows the total number of two-qubit gates $n_{JW}$ for inducing UCCSD ansatz states, implemented with the JW transformation. The distribution of $n_{GC+QSR}$ is described above. The chart 1350 also shows the numbers above plotted against the ratio $R = n_{GC+QSR}/(n_{JW} + n_{GC+QSR})$.

In one implementation, a choice can be made between QWC+QSR and GC+QSR, depending on the resource cost function. For example, if the two-qubit gate qualities are more demanding than the number of measurement to be made divided by the total runtime, QWC+QSR may be chosen. Otherwise, GC+QSR may be chosen.

Aspects of the present disclosure includes a method for predicting a first set of ansatz terms and first initial amplitudes associated with the first set of ansatz terms, minimizing energy of the system based on the first set of ansatz terms and the first initial amplitudes, calculating at least one of perturbative corrections in the energy or wavefunction based on one or more ansatz wavefunctions, determining whether energy of the system converges, and predicting, in response to determining that the energy of the system does not converge, a second set of ansatz terms and second initial amplitudes associated with the second set of ansatz terms.

An aspect of the present disclosure includes the method above, further comprising minimizing energy of the system based on the second set of ansatz terms.

Aspects of the present disclosure includes any of the method above, further comprising in response to determining that the energy of the system converges, generating an output of the simulation.

Aspects of the present disclosure includes any of the method above, wherein predicting the first set of ansatz terms and the first initial amplitudes comprises predicting using a second order Møller-Plesset (MP2) perturbation theory.

Aspects of the present disclosure includes any of the method above, wherein the first set of ansatz includes unitary coupled cluster ansatz with single or double excitations.

Aspects of the present disclosure includes any of the method above, wherein minimizing the energy of the system comprises calculating the energy using the variational quantum eigensolver (VQE) approach.

Aspects of the present disclosure includes any of the method above, further comprising computing an energy correction operator via a hybrid second order Møllar-Plesset perturbation (HMP2) method.

Aspects of the present disclosure includes any of the method above, further comprising compiling a circuit associated with the simulation, optimizing a circuit associated with the simulation, and executing the circuit via a quantum computer.

Aspects of the present disclosure includes any of the method above, wherein predicting the second set of ansatz terms and the second initial amplitudes comprises increasing ansatz sizes of the second set of ansatz terms.

Aspects of the present disclosure includes any of the method above, wherein predicting the second set of ansatz terms and the second initial amplitudes comprises determining one or more additional ansatz terms to add to the first set of ansatz terms for generating the second set of ansatz terms and adding the one or more additional ansatz terms to the first set of ansatz terms to generate the second set of ansatz terms, further comprising minimizing the energy of the system based on the second set of ansatz terms and the second initial amplitudes.

The previous description of the disclosure is provided to enable a person skilled in the art to make or use the disclosure. Various modifications to the disclosure will be readily apparent to those skilled in the art, and the common principles defined herein may be applied to other variations without departing from the spirit or scope of the disclosure. Furthermore, although elements of the described aspects may be described or claimed in the singular, the plural is contemplated unless limitation to the singular is explicitly stated. Additionally, all or a portion of any aspect may be utilized with all or a portion of any other aspect, unless stated otherwise. Thus, the disclosure is not to be limited to the examples and designs described herein but is to be accorded the widest scope consistent with the principles and novel features disclosed herein.

What is claimed is:

1. A method to reduce complexity in a simulation of a chemical system, comprising:

performing, by a classical processor, a first perturbation operation for obtaining a first set of ansatz terms and first initial amplitudes associated with the first set of ansatz terms;

iteratively performing, by the classical processor, the following operations until an energy of the chemical system converges to an energy conversion criterion:

a variational quantum eigensolver (VQE) simulation for minimizing energy of the chemical system based on the first set of ansatz terms and the first initial amplitudes, a second perturbation operation for calculating at least one of perturbative corrections in the energy of the chemical system or wavefunction based on one or more ansatz wavefunctions, a determining operation of whether the energy of the chemical system has converged to the energy conversion criterion after the second perturbation operation, and a third perturbation operation when the energy of the chemical system has not converged to the energy conversion criterion, the third perturbation operation obtaining a next set of ansatz terms and next initial amplitudes associated with the next set of ansatz terms to be provided to the VQE operation in a next cycle of the iteration, and the third perturbation operation being selected based on a size of an amplitude of the calculated perturbative corrections; and generating, by the classical processor when the energy of the chemical system has converged to the energy conversion criterion and based a current cycle of the iteration, an output of a ground-state energy estimate of the chemical system that is a ground-state energy estimate of particles of the chemical system; and compiling, by the classical processor, a circuit according to the simulation of the chemical system that is based on the ground-state energy estimate of the particles, wherein the compiling comprises mapping, to qubit indices, ansatz terms that cause the chemical system to converge by:

translating Fermionic operators comprised in the ansatz terms into qubit operations using one or more fermion-to-qubit transformations;

assigning the qubit operations that can be executed by a quantum processor to the qubit indices, wherein the qubit indices indicate a placement and application of gates within the circuit; and executing, by the quantum processor, the circuit to determine at least one of a chemical reaction, bonding property and energetic state of the chemical system.

2. The method of claim 1, wherein the first perturbation operation comprises predicting the first set of ansatz terms and the first initial amplitudes associated with the first set of ansatz terms.

3. The method of claim 2, wherein the predicting is performed based on a second order Møller-Plesset (MP2) perturbation.

4. The method of claim 1, wherein the third perturbation operation comprises predicting the next set of ansatz terms and the next initial amplitudes associated with the next set of ansatz terms.

5. The method of claim 4, wherein the predicting comprises increasing ansatz sizes of the next set of ansatz terms.

6. A non-transitory computer readable medium for reducing complexity in a simulation of a chemical system, the non-transitory computer readable medium having instructions stored therein that, when executed by a classical processor, cause the classical processor to:

perform a first perturbation operation for obtaining a first set of ansatz terms and first initial amplitudes associated with the first set of ansatz terms;

iteratively perform the following operations until an energy of the chemical system converges to an energy conversion criterion:

a variational quantum eigensolver (VQE) simulation for minimizing energy of the chemical system based on the first set of ansatz terms and the first initial amplitudes, a second perturbation operation for calculating at least one of perturbative corrections in the energy of the chemical system or wavefunction based on one or more ansatz wavefunctions, a determining operation of whether the energy of the chemical system has converged to the energy conversion criterion after the second perturbation operation, and a third perturbation operation when the energy of the chemical system has not converged to the energy conversion criterion, the third perturbation operation obtaining a next set of ansatz terms and next initial amplitudes associated with the next set of ansatz terms to be provided to the VQE operation in a next cycle of the iteration, and the third perturbation operation being selected based on a size of an amplitude of the calculated perturbative corrections; and generate, when the energy of the chemical system has converged to the energy conversion criterion and based a current cycle of the iteration, an output of a ground-state energy estimate of the chemical system that is a ground-state energy estimate of particles of the chemical system; and compile a circuit according to the simulation of the chemical system that is based on the ground-state energy estimate of the particles, wherein the compiling comprises mapping, to qubit indices, ansatz terms that cause the chemical system to converge by:

translating Fermionic operators comprised in the ansatz terms into qubit operations using one or more fermion-to-qubit transformations;

assigning the qubit operations that can be executed by a quantum processor to the qubit indices, wherein the qubit indices indicate a placement and application of gates within the circuit, and wherein the circuit is executed by the quantum processor to determine at least one of a chemical reaction, bonding property and energetic state of the chemical system.

7. The non-transitory computer readable medium of claim 6, wherein the instructions to perform the first perturbation operation comprise instructions for predicting the first set of ansatz terms and the first initial amplitudes associated with the first set of ansatz terms.

8. The non-transitory computer readable medium of claim 7, wherein the predicting is performed based on a second order Møller-Plesset (MP2) perturbation.

9. The non-transitory computer readable medium of claim 6, wherein the instructions to perform the third perturbation operation comprise instructions for predicting the next set of ansatz terms and the next initial amplitudes associated with the next set of ansatz terms.

10. The non-transitory computer readable medium of claim 9, wherein the predicting comprises increasing ansatz sizes of the next set of ansatz terms.

* * * * *